United States Patent
Wu

(10) Patent No.: US 9,441,828 B2
(45) Date of Patent: Sep. 13, 2016

(54) DISPLAY DEVICE, JOINT DISPLAY AND BACKLIGHT MODULE

(71) Applicant: Ye Xin Technology Consulting Co., Ltd., Hsinchu (TW)

(72) Inventor: I-Wei Wu, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 286 days.

(21) Appl. No.: 14/164,118

(22) Filed: Jan. 24, 2014

(65) Prior Publication Data

US 2014/0218971 A1    Aug. 7, 2014

(30) Foreign Application Priority Data

Feb. 5, 2013    (TW) .............................. 102104488 A
Feb. 5, 2013    (TW) .............................. 102104492 A
Sep. 27, 2013    (TW) .............................. 102135219 A

(51) Int. Cl.
*F21V 33/00*    (2006.01)
*G02B 6/08*    (2006.01)
*F21V 8/00*    (2006.01)

(52) U.S. Cl.
CPC .......... *F21V 33/0052* (2013.01); *G02B 6/0058* (2013.01); *G02B 6/08* (2013.01); *G02B 6/0038* (2013.01)

(58) Field of Classification Search
CPC .... F21V 33/0052; G02B 6/08; G02B 6/0058
See application file for complete search history.

(56) References Cited

U.S. PATENT DOCUMENTS

| | | | |
|---|---|---|---|
| 5,664,873 A | 9/1997 | Kanda et al. | |
| 6,927,908 B2 * | 8/2005 | Stark | G02F 1/13336 345/1.3 |
| 7,663,715 B2 * | 2/2010 | Jin | G02F 1/13336 349/58 |
| 2010/0053229 A1 * | 3/2010 | Krijn | G02B 6/0038 345/690 |

FOREIGN PATENT DOCUMENTS

CN    101965604 B    12/2012

* cited by examiner

*Primary Examiner* — David V Bruce
(74) *Attorney, Agent, or Firm* — Zhigang Ma

(57) ABSTRACT

A display device includes a display element, an image compensation element, and a backlight module. The display element includes a main display region and a periphery display region located at one side of the main display region, each of the main display region and the periphery display region includes a plurality of pixels. The image compensation element includes a compensation portion corresponding to the periphery display region, and the image compensation element extends an image of the periphery display region to one side of the periphery display region away from the main display region. The backlight module provides first light beams to the main display region and second light beams to the periphery display region, and an intensity of the first light beams is smaller than an intensity of the second light beams.

19 Claims, 30 Drawing Sheets

DISPLAY DEVICE, JOINT DISPLAY AND BACKLIGHT MODULE

CROSS-REFERENCE TO RELATED APPLICATIONS

This application is related to a U.S. patent application Ser. No. 14/164,139 and entitled "APPARATUS FOR COMPENSATING IMAGE OF DISPLAY AND METHOD FOR MANUFACTURING SAME", a U.S. patent application Ser. No. 14/164,140 and entitled "APPARATUS FOR COMPENSATING IMAGE OF DISPLAY AND METHOD FOR MANUFACTURING SAME", a U.S. patent application Ser. No. 14/164,136 and entitled "APPARATUS FOR COMPENSATING IMAGE OF DISPLAY, DISPLAY AND JOINT DISPLAY", and a U.S. patent application Ser. No. 14/164,137 and entitled "DISPLAY ELEMENT, DISPLAY DEVICE AND JOINT DISPLAY". This application also claims the foreign priority application filed in Taiwan as Serial No. 102104488 on Feb. 5, 2013, the foreign priority application filed in Taiwan as Serial No. 102104492 on Feb. 5, 2013, and Serial No. 102135219 on Sep. 27, 2013. These related applications are incorporated herein by reference

BACKGROUND

1. Technical Field

The present disclosure relates to a display device, a joint display including at least two of the display device and a backlight light module used in the display device.

2. Description of Related Art

Display devices are widely used in consumer electronic products. An increasing need is to provide a big display device for displaying an image having big size. Yet, the big display device is expensive. Thus, there is a need for providing a number of display devices having limited sizes to cooperatively display the image having big size, and a need for providing a backlight module used in the display devices.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will now be made to the drawings to describe various embodiments in detail.

Figure 1:
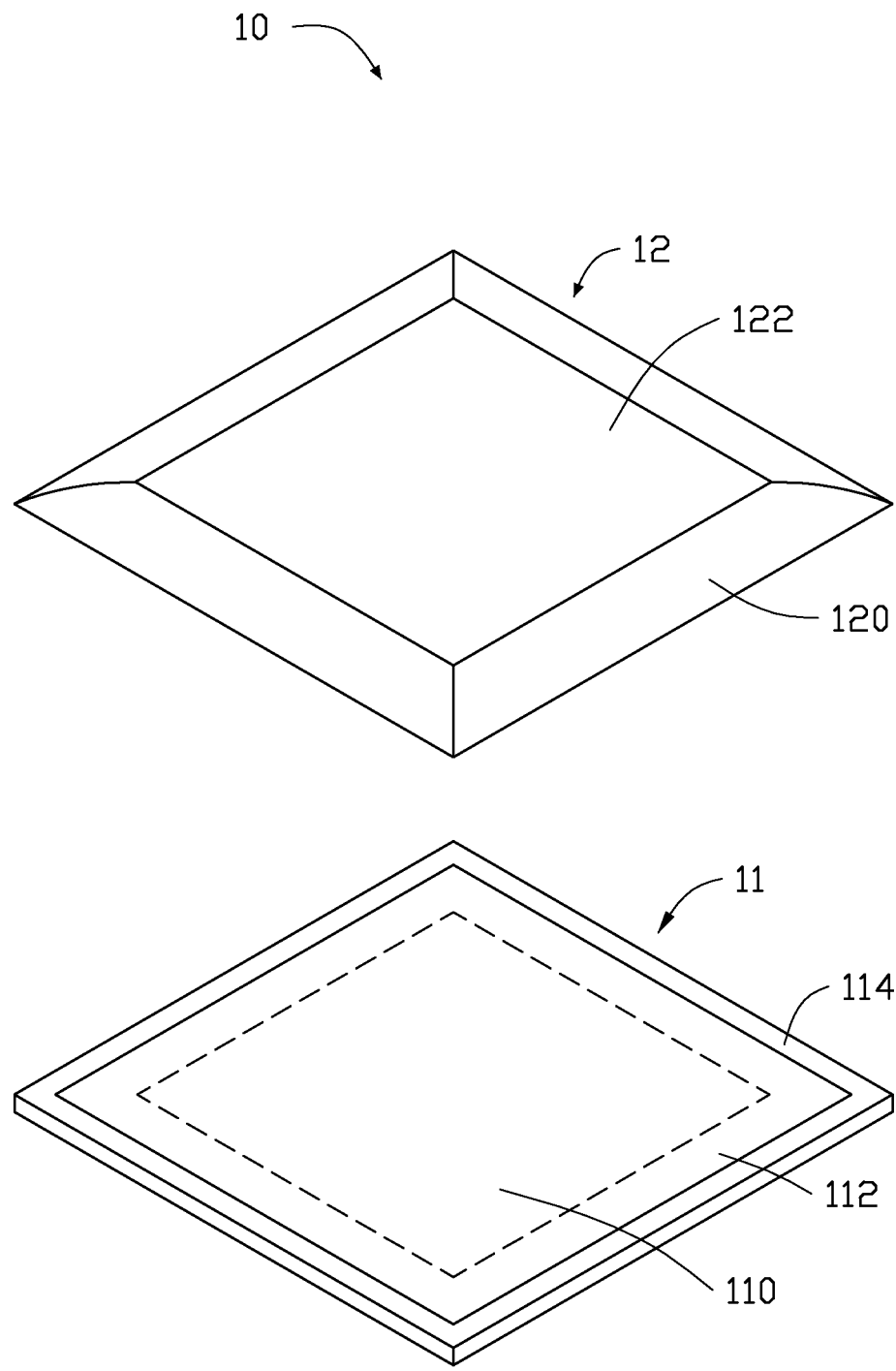
FIG. 1 is a schematic, exploded view of a first kind of display device of the present disclosure.
Figure 2:
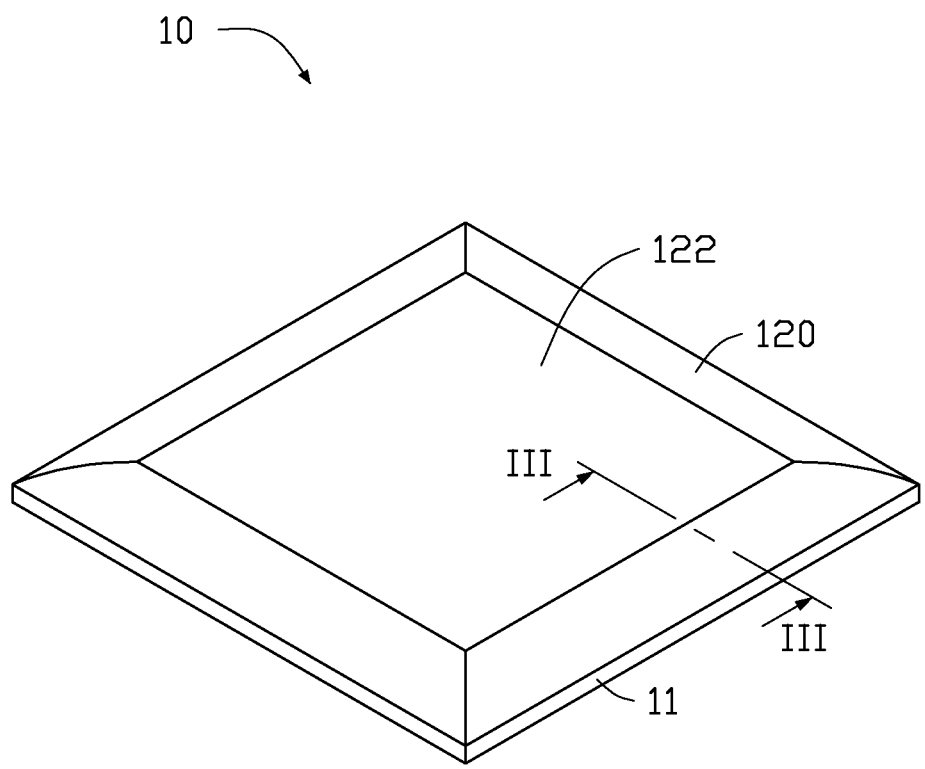
FIG. 2 is a schematic, isometric view of the display device of FIG. 1.
Figure 3:
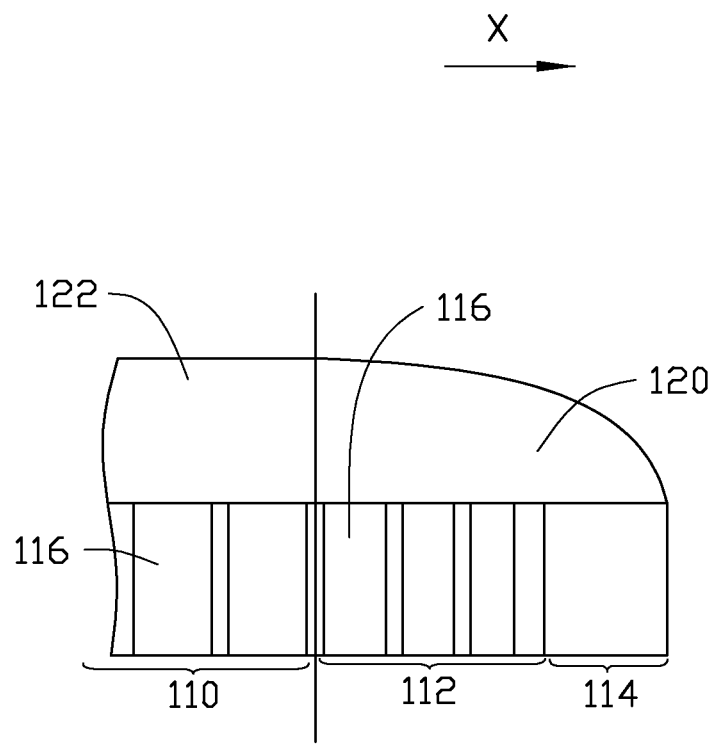
FIG. 3 is a sectional view taken along III-III line of FIG. 2.

FIGS. 1 through 3 show a display device 10. The display device 10 includes a display element 11 and an image compensation element 12. The display element 11 includes a main display region 110, a periphery display region 112 located at one side of the main display region 110 and a non-display region 114. The non-display region 110 can be a frame of the display device 10 which displays no image. It can be understood that the display element 11 can be a display panel or a display panel module which includes a display panel mounted in a frame.

The image compensation element 12 is located above the display element 11, such as on a display surface of the display element 11. The image compensation element 12 includes a compensation portion 120 corresponding to the periphery display region 112 and a transmission portion 122 connected to the periphery portion 112. The compensation portion 120 extends an image of the periphery display region 112 to one side of the periphery display region 112 away from the main display region 110. In detail, the compensation portion 120 extends the image of the periphery display region 112 to the non-display region 114. The compensation portion 120 includes an arc-shaped surface which defines a convex lens structure. The compensation portion 120 covers the periphery display region 112 and is projected at one side of the periphery display region 112 away from the main display region 110. In this embodiment, the compensation portion 120 fully covers the periphery display region 112 and the non-display region 114. The transmission portion 122 covers the main display region 110 and includes a flat light incident surface and a flat light emitting surface parallel to the flat light incident surface.

Figure 4:
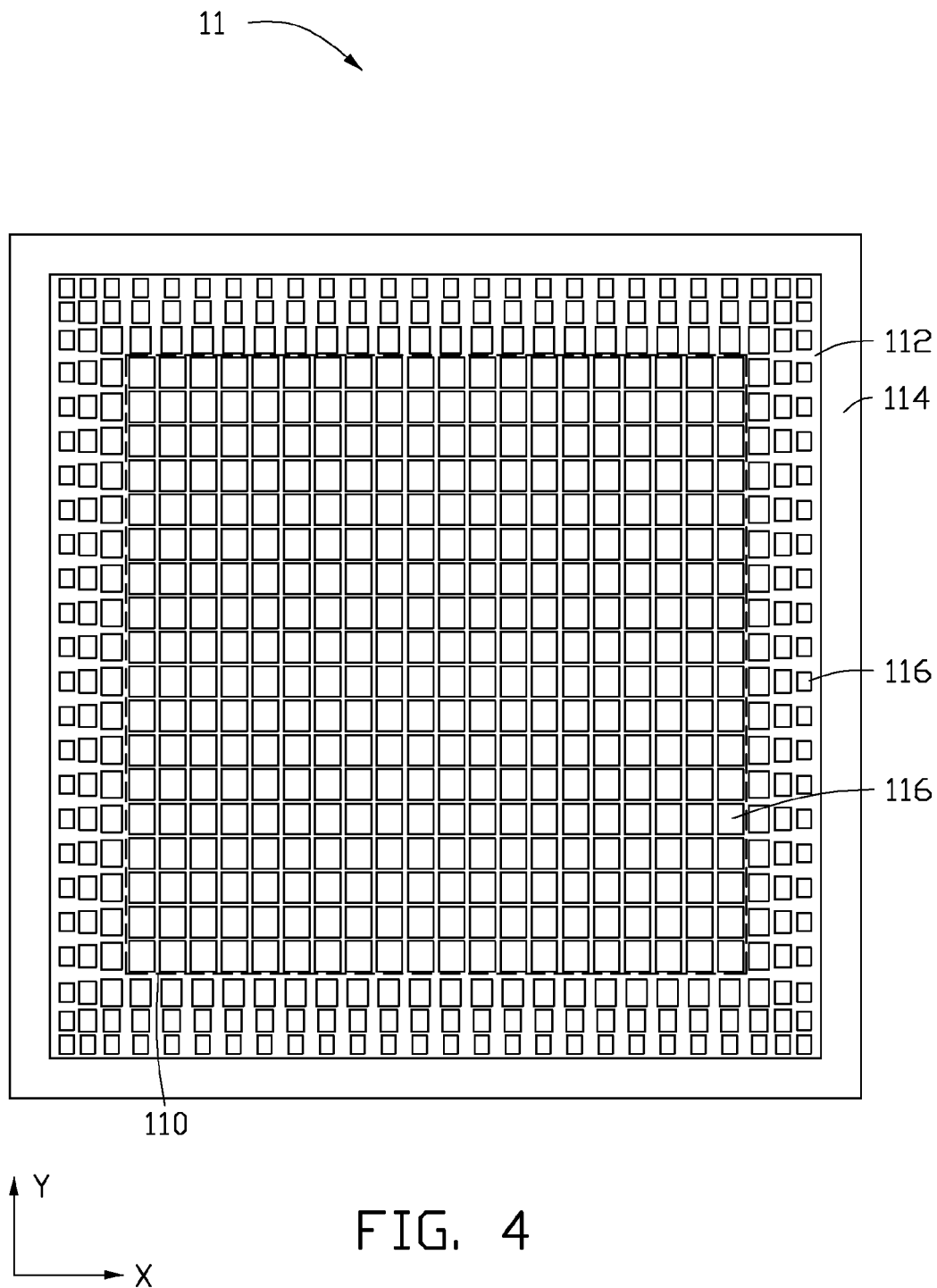
FIG. 4 is a schematic, top view of a display element of the display device of FIG. 1.

FIG. 4 shows the display element 11. The main display region 110 and the periphery display region 112 both include a number of pixels 116. The pixels 116 in the main display region 110 are evenly arranged and are equal in size. A density of the pixels 116 in the main display region 110 (per unit area) is smaller than a density of the pixels 116 in the periphery display region 112. in detail, a space between adjacent pixels 116 in the main display region 110 is substantially equal to or bigger than a space between adjacent pixels 116 in the periphery display region 112, and sizes of the pixels 116 in the periphery display region 112 is smaller than sizes of the pixels 116 in the main display region 110. Such as, lengths of the pixels 116 in the periphery display region 112 is smaller than lengths of the pixels 116 in the main display region 110, or widths of the pixels 116 in the periphery display region 112 is smaller than widths of the pixels 116 in the main display region 110. In this embodiment, lengths and widths of the pixels 116 in the main display region 110 are smaller than lengths and widths of the pixels 116 in the periphery display region 110 respectively. Wherein a length of a pixel 116 is a length of the pixel 116 along a Y direction perpendicular to a X direction, and a width of the pixel 116 is a width of the pixel 116 along the X direction.

In this embodiment, the display element 11 can be display panel, such as liquid crystal display panel and organic light-emitting diode display panel.

Furthermore, the density of the pixels 116 in the periphery display region 112 increases along a direction away from the main display region 110. For example, a density of the pixels 116 in the periphery portion 112 at the right side of FIG. 4 increases along a positive X direction, a density of the pixels 116 in the periphery portion 112 at the top side of FIG. 4 increases along a positive Y direction, densities of the pixels 116 in the periphery portion 112 at the left side and at the right side of FIG. 4 are axial symmetrical, and densities of the pixels 116 in the periphery portion 112 at the top side and at the bottom side of FIG. 4 are axial symmetrical. In detail, spaces between adjacent pixels 116 in the periphery display region 112 can be constant or decrease along a direction away from the main display body 110, lengths of the pixels 116 in the periphery display region 112 decreases along the direction away from the main display region 110, and/or widths of the pixels 116 in the periphery display region 112 decreases along the direction away from the main display region 110.

When working, light emitted from the main display region 110 are substantially changelessly transmitted through the transmission portion 122. The compensation portion 120 changes the transmitting direction of the light emitted from the periphery display region 112 to extend an image of pixels 116 in the periphery display region 112 to one side of the periphery display region 112 (the non-display region 114). The compensation portion 120 amplifies the image of the pixels 116 in the periphery display region 112 to make an image of each pixel 116 in the periphery display region 112 is substantially equal to an image of each pixel 116 in the main display region 110 in size.

The compensation portion 120 extends the image of periphery display region 112 to the non-display region 114, thus, an image displayed by the display element 11 is larger than a sum of the main display region 110 and the periphery display region 112. Furthermore, the non-display region 114 is invisible to a viewer, thus, the display device 10 has a frame-less displaying effect.

Figure 5:
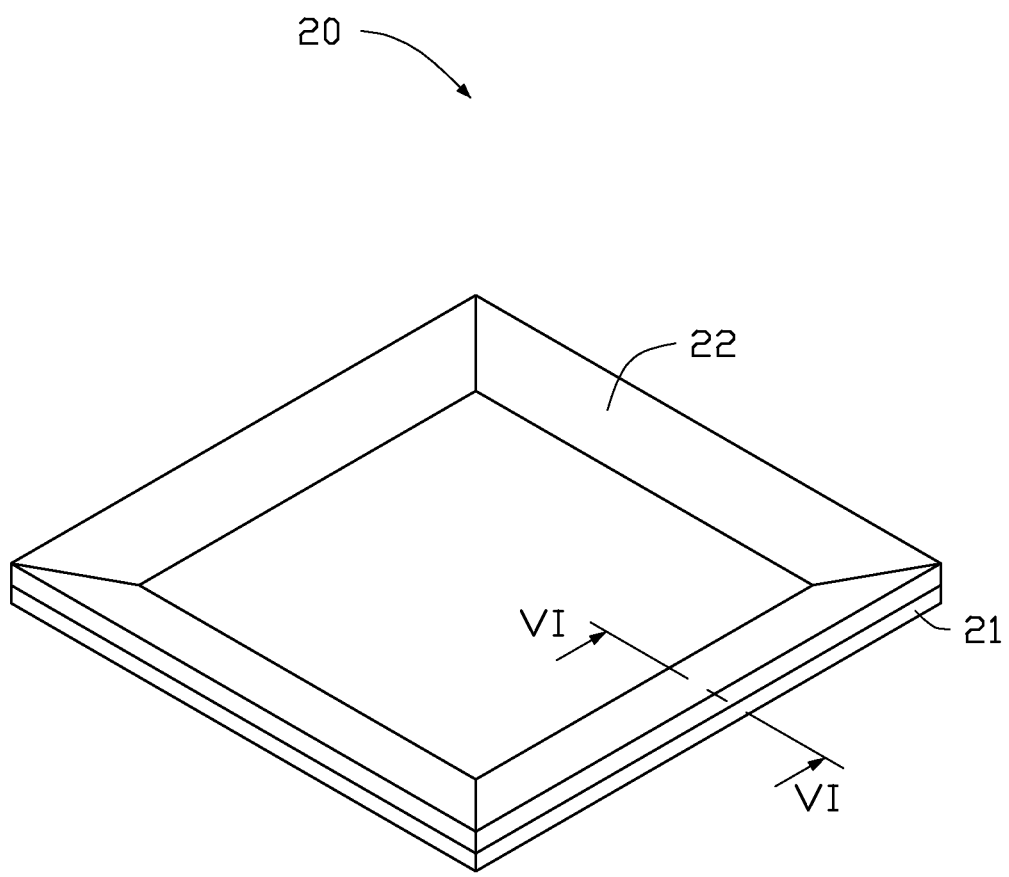
FIG. 5 is a schematic, isometric view of a second kind of display device of the present disclosure.
Figure 6:
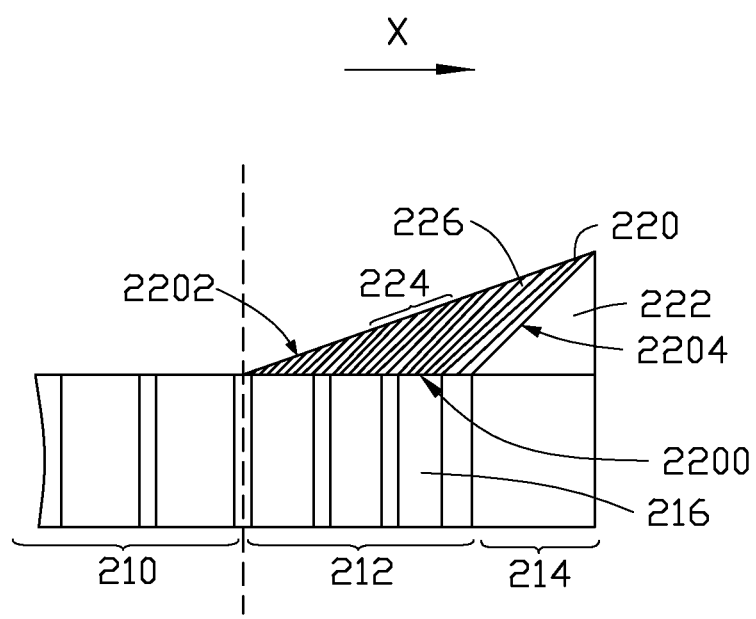
FIG. 6 is a sectional view taken along VI-VI line of FIG. 5.

FIGS. 5 and 6 show a display device 20. The display device 20 is similar to the display device 10 but a structure of a image compensation element 22 of the display device 20 is different from a structure of the image compensation element 12. The image compensation element 22 includes a compensation portion 220 and a support portion 222 connected to the compensation portion 220. The compensation portion 220 corresponds to a periphery display region 212. The compensation portion 220 is projected from the periphery display region 212 and an orthogonal projection of the compensation portion 220 on a display element 21 covers a non-display region 214. The support portion 222 is located on the non-display region 214 and connects to the compensation portion 220.

The compensation 220 includes a number of light guiding channels 224. The light guiding channels 224 amplify images of pixels 216 in the periphery display region 212 and extend the images to one side of the periphery display region 212. An amplifying ratio of the images increase along a positive X direction which is away from a main display region 210.

In detail, the compensation portion 220 includes a light incident surface 2200 and a light emitting surface 2202. The light incident surface 2200 corresponds to the periphery display region 212. An orthogonal projection of the light emitting surface 2202 on the display element 21 is larger than the light incident surface 2200. The light guiding channel 224 extend from the light incident surface 2200 to the light emitting surface 2202. A section area of the light guiding channel 224 increases along the direction from the light incident surface 2200 to the light emitting surface 2202. The light guiding channel 224 extends from the periphery display region 212 to one side of the periphery display region 212 away from the main display region 210. A section of the compensation portion 220 is an obtuse triangle. The compensation portion 20 further includes an inclined surface 2204 connected to the support portion 222. An end of the light emitting surface 2202 is connected to the light incident surface 2200, the other end of the light emitting surface 2202 is connected to the inclined surface 2204. An included angle between the inclined surface 2204 and the light incident surface 2200 is an obtuse angle.

Figure 7:
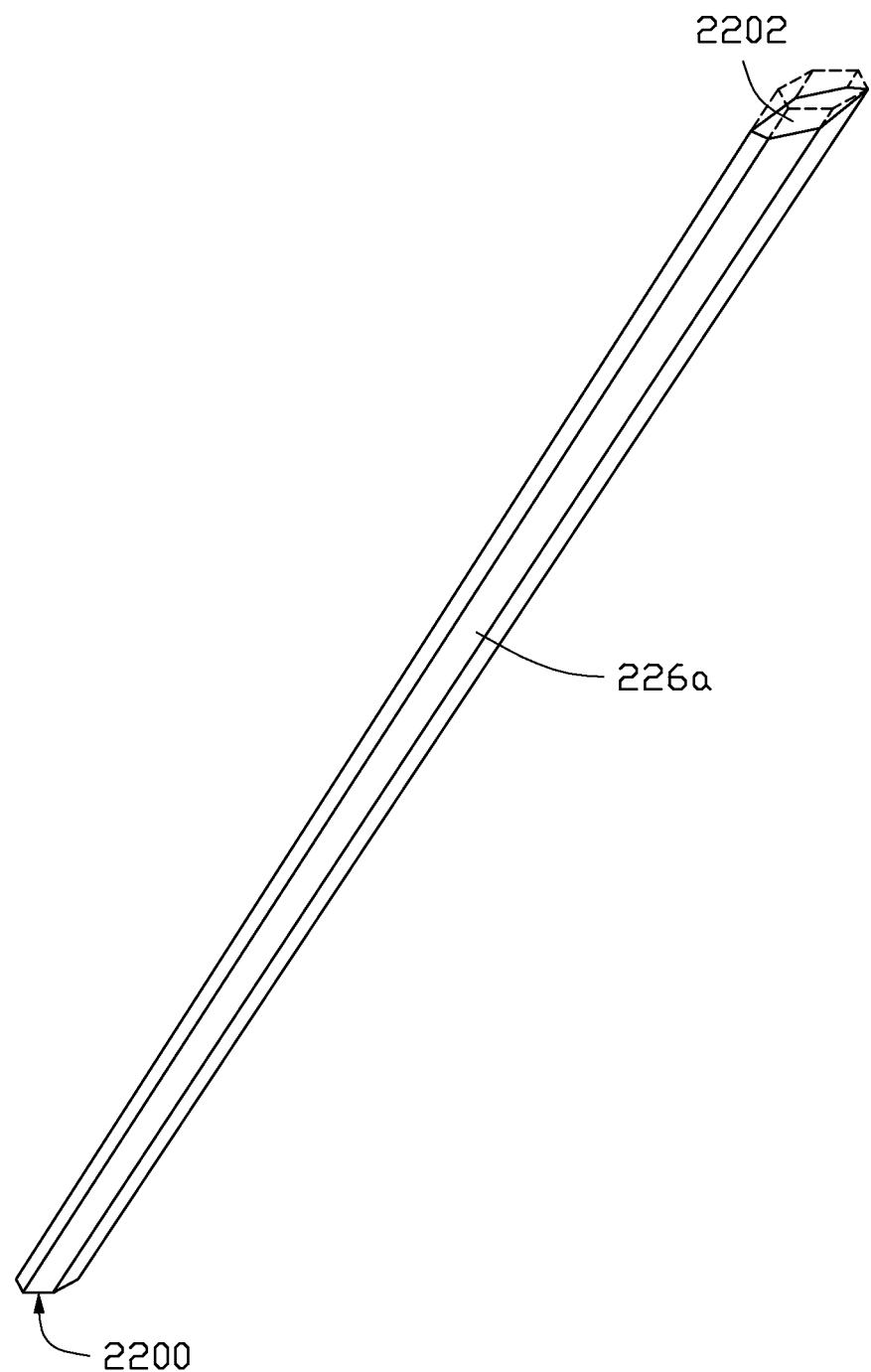
FIG. 7 is a schematic, isometric view of one kind of light guiding fiber.

In this embodiment, the light guiding channels 224 includes a number of optical guiding fibers 226. FIG. 7 shows one kind of optical guiding fibers 226a. An area of the light guiding fiber 226a on the light emitting surface 2202 is greater than an area of the light guiding fiber 226a on the light incident surface 2200, a ratio of the area of the light guiding fiber 226a on the light emitting surface 2202 to the area of the light guiding fiber 226a on the light incident surface 2200 increases along a direction away from the main display region 210, and a section area of the light guiding fiber 226a increases along the direction from the light incident surface 2200 to the light emitting surface 2202 (a diameter of the optical guiding fiber 226a increases along the direction from the light incident surface 2200 to the light emitting surface 2202). In this way, images of pixels 216 in the periphery display region 212 and amplified by the corresponding light guiding channels 224 are substantially equal to each other and equal to images of the pixels 216 in the main display region 212. An amplifying ratio of the light guiding fiber 226a is determined by a ratio of the area of the light guiding fiber 226a on the light emitting surface 2202 to the area of the light guiding fiber 226a on the light incident surface 2200, that is, determined by an inclining degree of the light emitting surface 2202 and an ratio of the diameter of the light guiding fiber 226 on the light emitting surface 2202 to the diameter of the light guiding fiber 226 on the light incident surface 2200.

Figure 8:
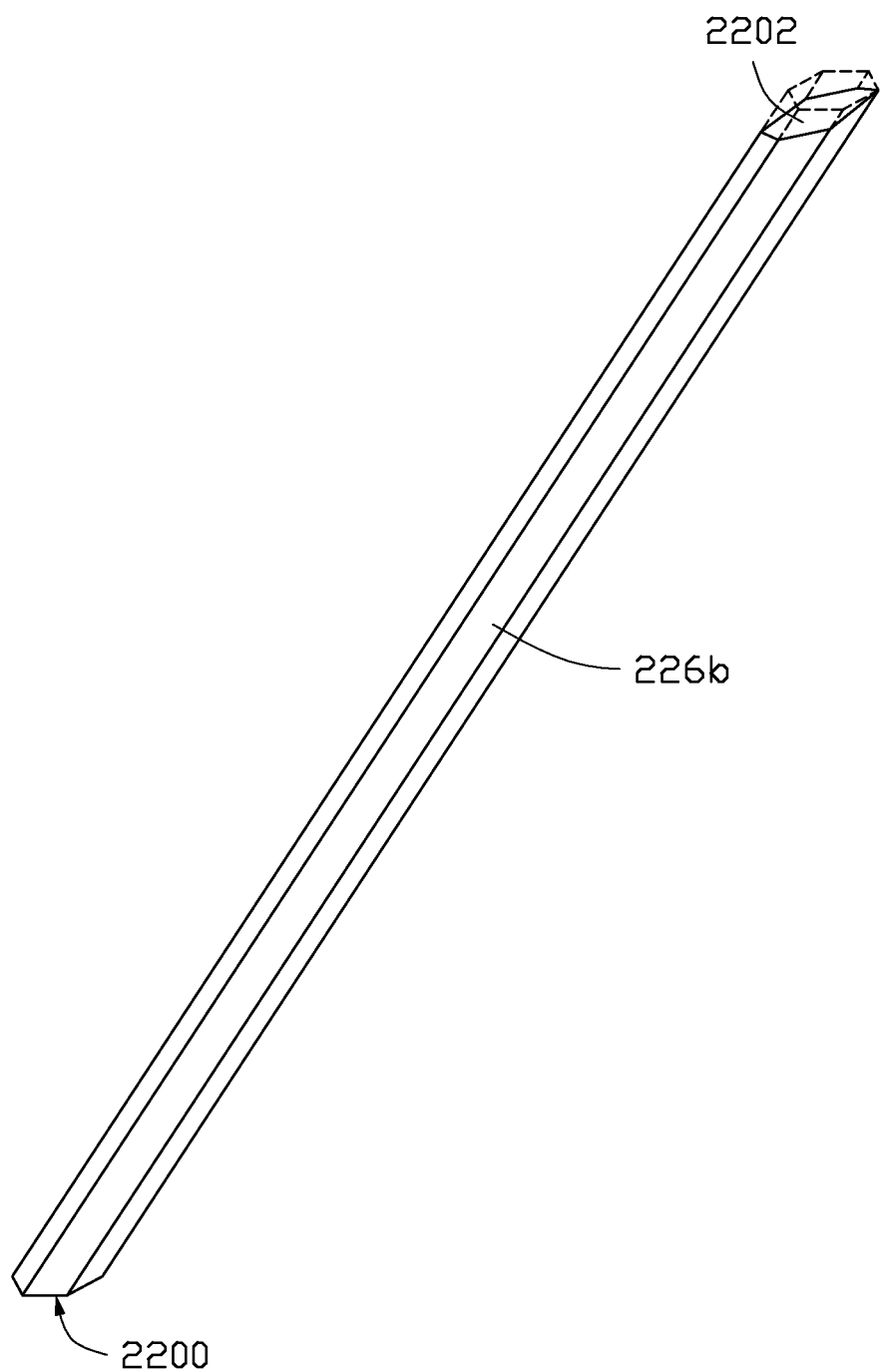
FIG. 8 is a schematic, isometric view of another kind of light guiding fiber.

FIG. 8 shows another kind of optical guiding fiber 226b. The optical guiding fiber 226b extends from the light incident surface 2200 to the light emitting surface 2202. A section area of the optical guiding fiber 226 is constant along the direction from the light incident surface 2200 to the light emitting surface 2202 (a diameter of the optical guiding fiber 226a is constant along the direction from the light incident surface 2200 to the light emitting surface 2202). An amplifying ratio of the light guiding fiber 226a is mainly determined by an inclining degree of the light emitting surface 2202.

In other embodiment, the light guiding channels 224 may include a number of optical fibers, a light guide plate, and so on.

As the image compensation element 12 of the display device 10 defines a convex lens structure, light emitted from the image compensation element 12 is disordered and scattered, which makes the image amplified by the image compensation element 12 has a relatively bad definition. On the contrary, the image compensation element 22 has a number of light guiding channels 224 independent from each other, light emitted from the image compensation element 22 will not be disordered and scattered, which makes image amplified by the image compensation element 22 has a relatively high definition.

Figure 9:
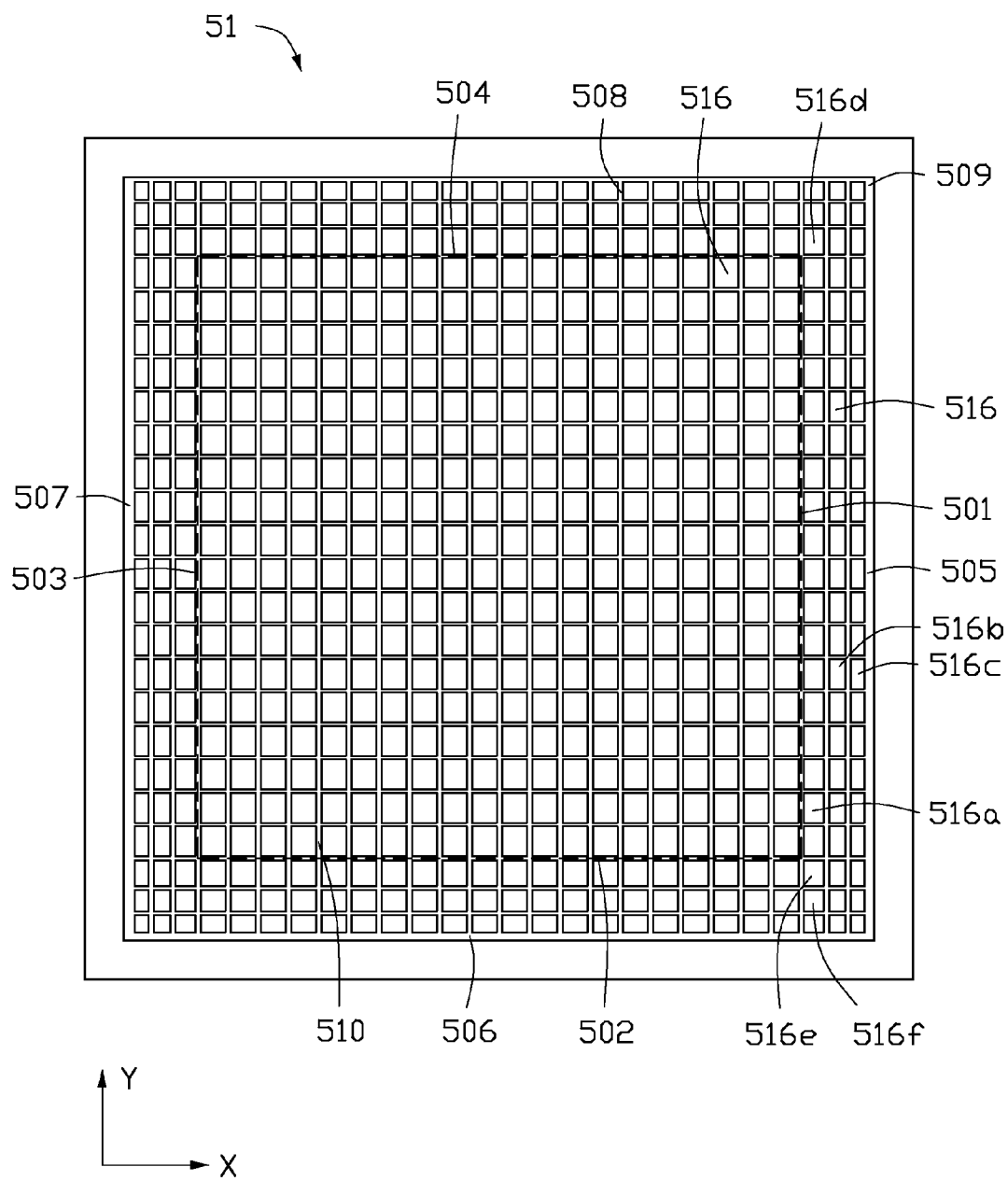
FIG. 9 is a schematic, top view of a display element of a third kind of display device of the present disclosure.

FIG. 9 shows a display element 51. The display element 51 is different from the display element 11 shown in FIG. 4. In detail, a change regulation of the length and the width of pixels 516 in periphery display regions 505 through 508 of the display element 51 differ from a change regulation of the length and the width of pixels 116 in the periphery display region 112 of the display element 11. Wherein a length of a pixel 516 is a length of the pixel 516 along the Y direction perpendicular to the X direction, and a width of the pixel 516 is a width of the pixel 516 along the X direction.

A main display region of the display element 51 includes a first side 501, a second side 502 adjacent to the first side 501, a third side 503 opposite to the first side 501, and a forth side 504 opposite to the second side 502. A first periphery display region 505 is adjacent to the first side 501. A length of the pixel 516 in the first periphery display region 505 is equal to a length of the pixel 516 in the main display region 510, a width of the pixel 516 in the first periphery display region 505 is smaller than a width of the pixel 516 in the main display region 510, and widths of the pixels 516 in the first periphery display region 505 decrease along a direction away from the main display region 510. The first periphery display region 505 includes pixels 516a adjacent to the main display region 510 (in other words, nearest to the main display region 510). A width W1 of the pixel 516a is smaller than a width W2 of the pixels 516 in the main display region 510 at one third, that is, $W1=W2-\frac{1}{3}W2=\frac{2}{3}W2$. The first periphery display region 505 further includes each two adjacent pixels 516b, 516c arranged in a same row along a direction away from the main display region 510. The pixel 516b is nearer to the main display region 510 relative to the pixel 516c. A width W3 of the pixel 516c is smaller than a width W4 of the pixels 516b at one third, that is, $W3=W4-\frac{1}{3}W4=\frac{2}{3}W4$.

A second periphery display region 506 is adjacent to the second side 502. A width of the pixel 516 in the second periphery display region 506 is equal to a width of the pixel 516 in the main display region 510, a length of the pixel 516 in the second periphery display region 506 is smaller than a length of the pixel 516 in the main display region 510, and lengths of the pixels 516 in the second periphery display region 506 decrease along a direction away from the main display region 510. The second periphery display region 506 includes pixels 516a adjacent to the main display region 510 (in other words, nearest to the main display region 510). A length L1 of the pixel 516a is smaller than a length L2 of the pixels 516 in the main display region 510 at one third, that is, $L1=L2-\frac{1}{3}L2=\frac{2}{3}L2$. The second periphery display region 506 further includes each two adjacent pixels 516b, 516c arranged in a same column along a direction away from the main display region 510. The pixel 516b is nearer to the main display region 510 relative to the pixel 516c. A length L3 of the pixel 516c is smaller than a length L4 of the pixels 516b at one third, that is, $L3=L4-\frac{1}{3}L4=\frac{2}{3}L4$.

A third periphery display region 507 is adjacent to the third side 503. A length of the pixel 516 in the third periphery display region 507 is equal to a length of the pixel 516 in the main display region 510, a width of the pixel 516 in the third periphery display region 507 is smaller than a width of the pixel 516 in the main display region 510, and widths of the pixels 516 in the third periphery display region 507 decrease along a direction away from the main display region 510. The third periphery display region 507 includes pixels 516a adjacent to the main display region 510 (in other words, nearest to the main display region 510). A width W1 of the pixel 516a is smaller than a width W2 of the pixels 516 in the main display region 510 at one third, that is, $W1=W2-\frac{1}{3}W2=\frac{2}{3}W2$. The third periphery display region 507 further includes each two adjacent pixels 516b, 516c arranged in a same row along a direction away from the main display region 510. The pixel 516b is nearer to the main display region 510 relative to the pixel 516c. A width W3 of the pixel 516c is smaller than a width W4 of the pixels 516b at one third, that is, $W3=W4-\frac{1}{3}W4=\frac{2}{3}W4$.

A fourth periphery display region 508 is adjacent to the fourth side 504. A width of the pixel 516 in the fourth periphery display region 508 is equal to a width of the pixel 516 in the main display region 510, a length of the pixel 516 in the fourth periphery display region 508 is smaller than a length of the pixel 516 in the main display region 510, and lengths of the pixels 516 in the fourth periphery display region 508 decrease along a direction away from the main display region 510. The fourth periphery display region 508 includes pixels 516a adjacent to the main display region 510 (in other words, nearest to the main display region 510). A length L1 of the pixel 516a is smaller than a length L2 of the pixels 516 in the main display region 510 at one third, that is, $L1=L2-\frac{1}{3}L2=\frac{2}{3}L2$. The fourth periphery display region 508 further includes each two adjacent pixels 516b, 516c arranged in a same column along a direction away from the main display region 510. The pixel 516b is nearer to the main display region 510 relative to the pixel 516c. A length L3 of the pixel 516c is smaller than a length L4 of the pixels 516b at one third, that is, $L3=L4-\frac{1}{3}L4=\frac{2}{3}L4$.

A fifth periphery display region 509 is adjacent to each corner of the main display region 510. A width of the pixel 516 in the fifth periphery display region 509 is smaller than a width of the pixel 516 in the main display region 510, a length of the pixel 516 in the fifth periphery display region 509 is smaller than a length of the pixel 516 in the main display region 510, and widths and lengths of the pixels 516 in the fifth periphery display region 508 both decrease along a direction away from the main display region 510. The fifth periphery display region 509 includes pixels 516*d* adjacent to the main display region 510 (in other words, nearest to the main display region 510). A length L1 of the pixel 516*d* is smaller than a length L2 of the pixels 516 in the main display region 510 at one third, that is, L1=L2−⅓L2=⅔L2. A width W1 of the pixel 516*d* is smaller than a width W2 of the pixels 516 in the main display region 510 at one third, that is, W1=W2−⅓W2=⅔W2. The fifth periphery display region 509 further includes each two adjacent pixels 516*e*, 516*f* arranged in a same column or in a same row along a direction away from the main display region 510. The pixel 516*e* is nearer to the main display region 510 relative to the pixel 516*f*. A length L3 of the pixel 516*f* is smaller than a length L4 of the pixels 516*e* at one third, that is, L3=L4−⅓L4=⅔L4. A width W3 of the pixel 516*f* is smaller than a width W4 of the pixels 516*e* at one third, that is, W3=W4−⅓W4=⅔W4.

Furthermore, spaces between pixels 516 in the periphery display regions 505 through 509 is smaller than spaces between pixels 516 in the main display region 510, and spaces between pixels 516 in the periphery display regions 505 through 509 decrease along a direction away from the main display region 510. In this embodiment, each space D1 between pixels 516 in the periphery display regions 505 through 509 is smaller than a space D2 between pixels 516 which is next to the space D1 along a direction towards the main display region 510 at one third, that is, D1=D2−⅓D2=⅔D2.

In detail, for making sure that an image of each pixel 516 in the periphery display regions 505 through 509 after being amplified by the image compensation element 12 or 22 is substantially equal to an image of each pixel 516 in the main display region 510, an image of pixel 516 in the first or third periphery display region 505, 507 only needs to be amplified in a widthwise direction, and does not needs to be amplified in a lengthwise direction; an image of pixel 516 in the second or fourth periphery display region 506, 508 only needs to be amplified in a lengthwise direction, and does not needs to be amplified in a widthwise direction; and an image of pixel 516 in the fifth periphery display region 509 needs to be amplified both in a widthwise direction and in a lengthwise direction.

When the image compensation element 12 having a convex lens structure is used on the display element 51, the light emitting surface of the image compensation element 12 needs to have different radians corresponding to different periphery display regions 505 through 509, so that an image of each pixel 516 in the periphery display regions 505 through 509 after being amplified by the image compensation element 12 is substantially equal to an image of each pixel 516 in the main display region 510.

When the image compensation element 22 is used on the display element 51, different light guiding channels of the image compensation element 22 corresponding to different periphery display regions 505 through 509 have different structures and different amplifying effect so that image of each pixel 516 in the periphery display regions 505 through 509 after being amplified by the image compensation element 12 is substantially equal to an image of each pixel 516 in the main display region 510.

Figure 10:
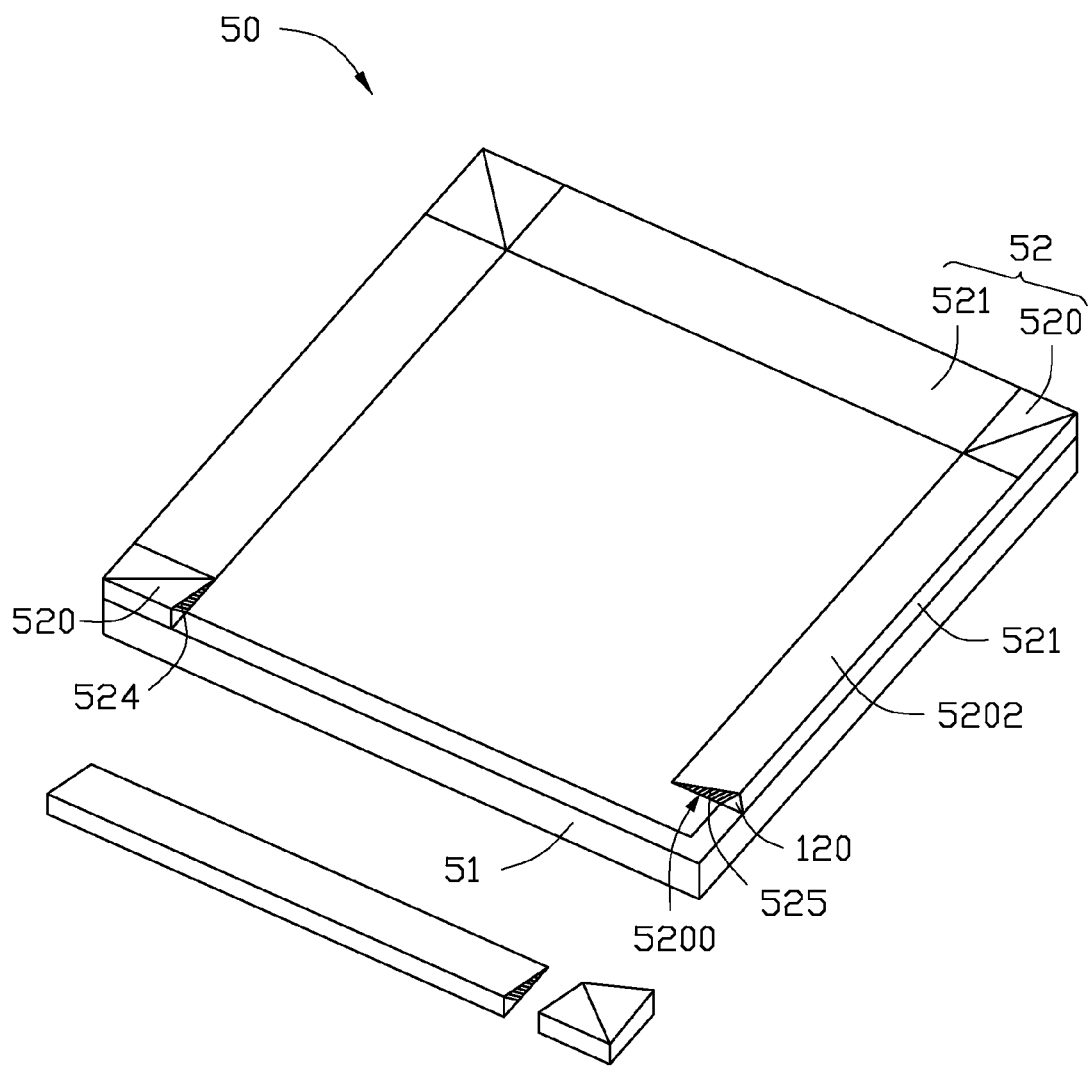
FIG. 10 is a schematic view of the third kind of display device of the present disclosure.

FIG. 10 shows a display device 50 includes the display element 51 and an image compensation element 52 on the display element 51. The image compensation element 52 have light guiding channels. In detail, the image compensation element 52 includes compensation portions 521 corresponding to the first through fourth periphery display regions 505 through 508. The compensation portion 521 includes light guiding channels 525 constructed by light guiding fibers 226*b* of FIG. 8, that is, the light guiding channel 525 extends from a light incident surface 5200 to a light emitting surface 5202, and a section area of the light guiding channel 525 keeps constant. An amplifying ratio of the light guiding channel 525 is mainly determined by an inclining degree of the light emitting surface 5202. The image compensation element 52 further includes compensation portions 520 corresponding to the fifth periphery display regions 509. The compensation portion 520 includes light guiding channels 524 constructed by light guiding fibers 226*a* of FIG. 7, that is, the light guiding channel 524 extends from the light incident surface 5200 to the light emitting surface 5202, and a section area of the light guiding channel 524 increases from the light incident surface 5200 to the light emitting surface 5202. An amplifying ratio of the light guiding channel 524 is determined by an inclining degree of the light emitting surface 5202 and a ratio of the diameter of the light guiding fiber 226*a* on the light emitting surface 5202 to the diameter of the light guiding fiber 226*a* on the light incident surface 5200.

The compensation portions 520, 521 are jointed together by glue or other connecting agent, and are fixed to the display element 51 by glue or other connecting agent.

The pixels 516 in the first and third periphery display regions 505 and 507 are only smaller than pixels 516 in the main display region 510 in width, the pixels 516 in the second and fourth periphery display regions 506 and 508 are only smaller than pixels 516 in the main display region 510 in length, and the pixels 516 in the fifth periphery display regions 509 are smaller than pixels 516 in the main display region 510 both in length and width. In this way, when the display element 51 is made, there is only a need to make gaps between horizontal driving lines and vertical driving lines for driving the pixels 516 (such as scan lines and data lines of a liquid crystal display panel) in the periphery display regions 505 through 509 smaller than that in the main display region 510. Thus, it is relatively simple to make the display element 51.

In another embodiment, the compensation portions 520 corresponding to the fifth periphery display regions 509 includes light guiding channels and light guiding fibers similar to the light guiding channels and light guiding fibers of compensation portions 521 corresponding to the first through fourth periphery display regions 505 through 508. As the pixels 516 is very small in size, people cannot distinguish the difference between the sizes of images of the pixels 516 in the fifth periphery display region 509 and that in the first through fourth periphery display region 505 through 508, thus, the display device can still have a good display effect.

Figure 11:
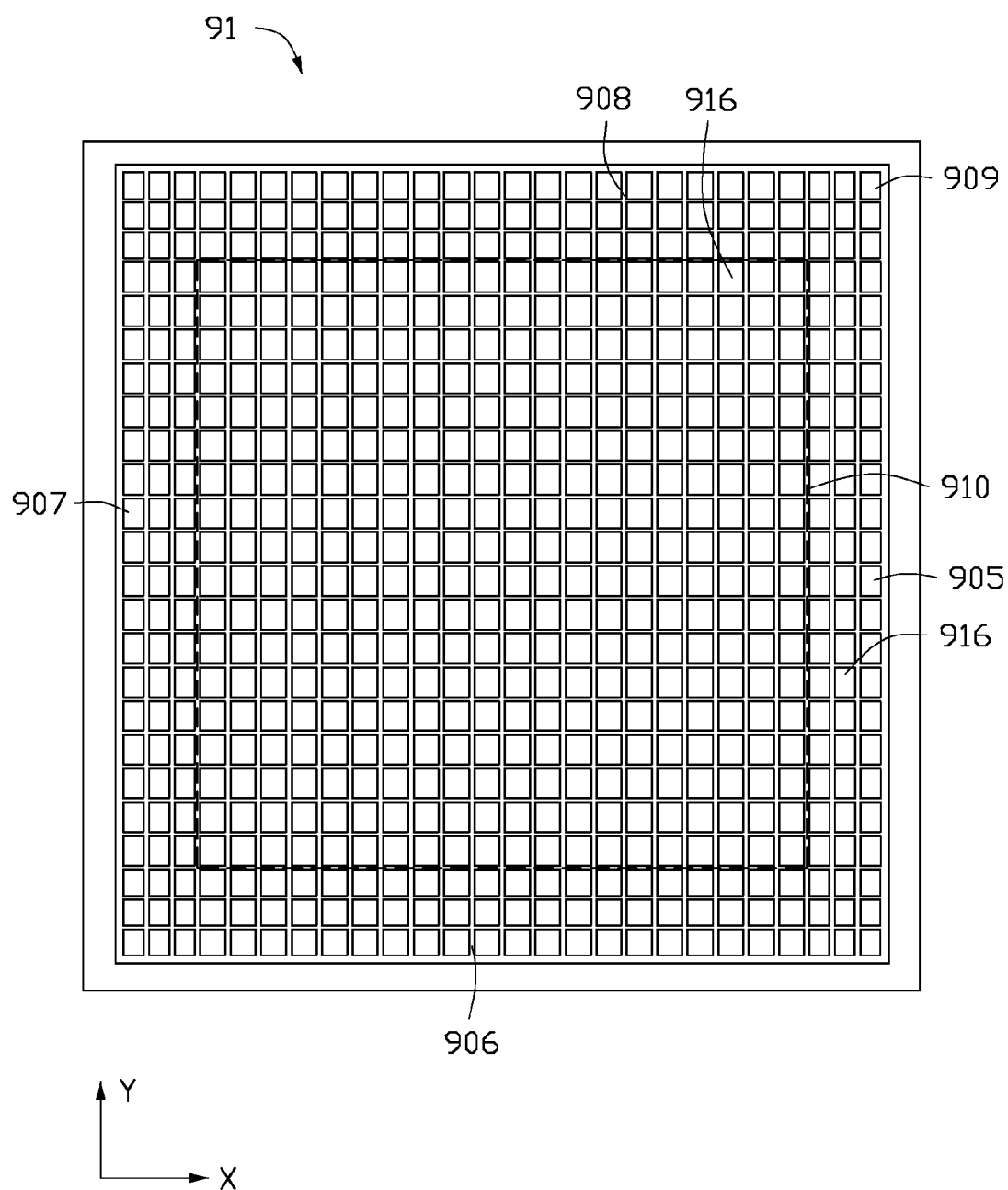
FIG. 11 is a schematic, top view of a display element of a fourth kind of display device of the present disclosure.

FIG. 11 shows a display element 91. The display element 91 is different from the display element 51 shown in FIG. 9. In detail, a change regulation of the length and the width of pixels 916 in periphery display regions 905 through 909 of the display element 91 differ from a change regulation of the length and the width of pixels 516 in the periphery display regions 505 through 509 of the display element 51.

A length of the pixel 916 in the periphery display regions 905, 907 at left and right side of the display element 91 is equal to a length of the pixel 916 in a main display region 910, a width of the pixel 916 in the periphery display regions 905, 907 is smaller than a width of the pixel 916 in the main display region 910, and widths of the pixels 916 in the periphery display regions 905, 907 are equal to each other. A width of the pixel 916 in the periphery display regions 906, 908 at top and bottom side of the display element 91 is equal to a width of the pixel 916 in the main display region 910, a length of the pixel 916 in the periphery display regions 906, 908 is smaller than a length of the pixel 916 in the main display region 910, and lengths of the pixels 916 in the periphery display regions 906, 908 are equal to each other. A width of the pixel 916 in the periphery display regions 909 at the corners of the display element 91 is equal to a width of the pixel 916 in the periphery display regions 905 and 907, and a length of the pixel 516 in the periphery display regions 909 is equal to a length of the pixel 916 in the periphery display regions 906 and 908.

All the above mentioned image compensation elements, optimally, the image compensation element 52 of FIG. 10, can be arranged on the periphery display regions 905 through 909 of the display element 91, to make sure an image of each pixel 916 in the periphery display regions 905 through 909 after being amplified by the image compensation element 52 is equal to an image of each pixel 916 in the main display region 910. As the section area of the light guiding channel 525 of the compensation portion 521 keeps constant, and an area of different light guiding channels 525 at the light emitting surface 5202 are constant, amplifying ratio of images to pixels 916 in each periphery display regions 905 through 908 are constant. As the amplifying ratio and the size of pixels 916 in each periphery display regions 905 through 908 are constant, the size of images of the pixels 916 in each periphery display regions 905 through 908 after amplified are equal to each other. The images of pixel 916 in the periphery display region 909 are amplified both in a widthwise direction and in a lengthwise direction by the compensation portion 520.

Figure 12:
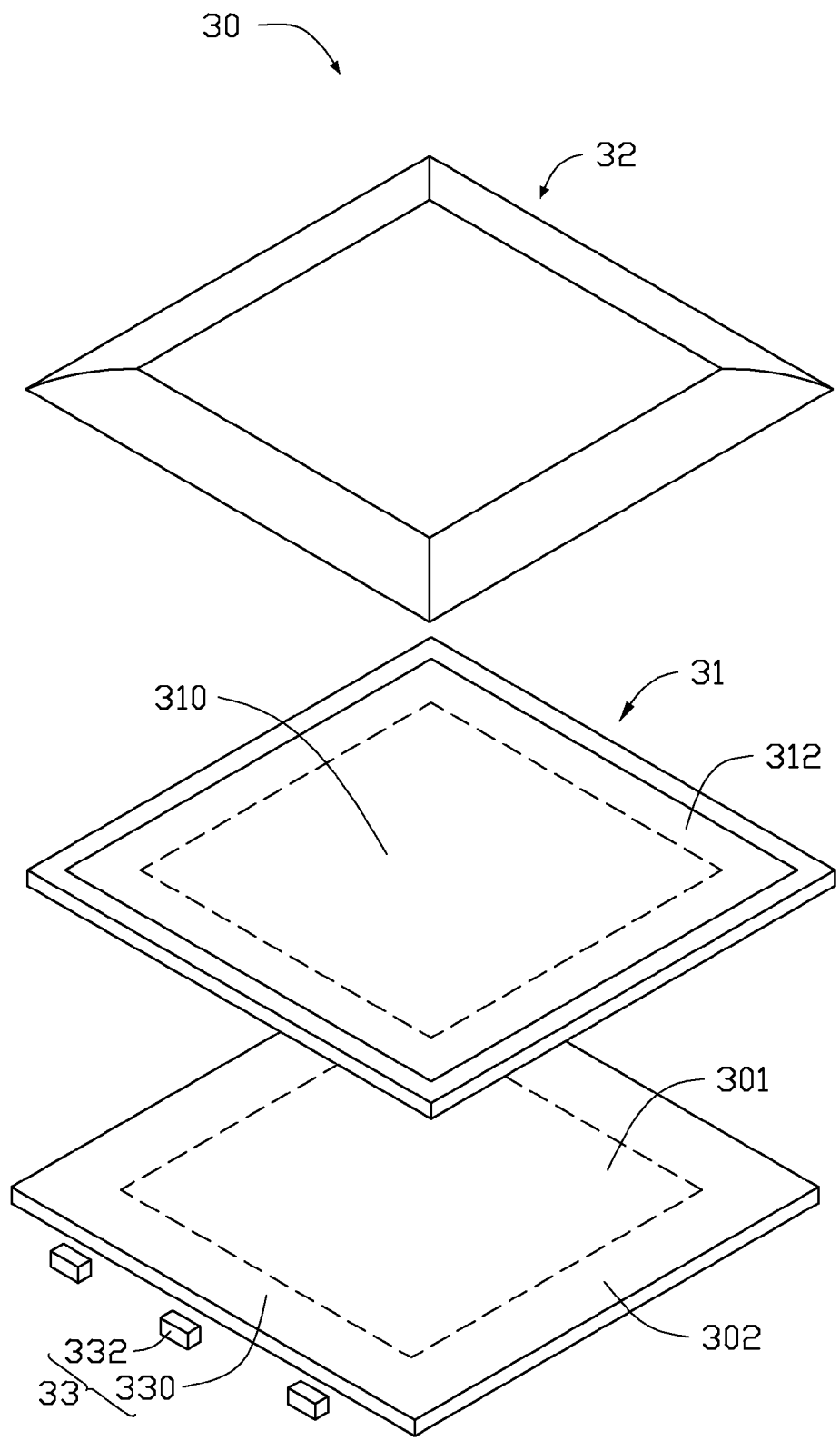
FIG. 12 is a schematic, exploded view of a fifth kind of display device of the present disclosure.
Figure 13:
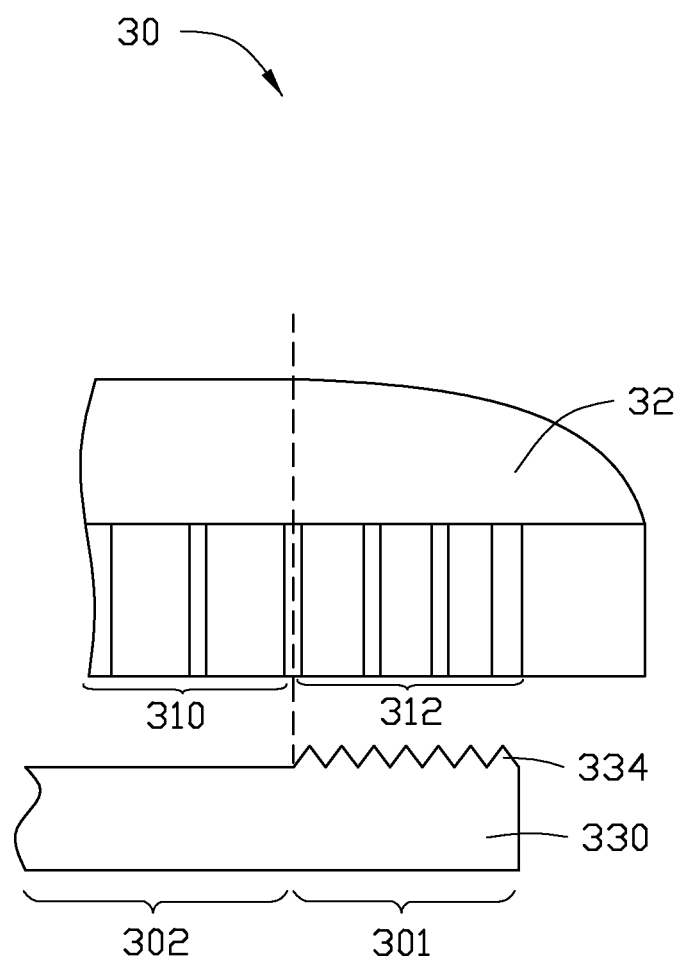
FIG. 13 is a sectional view of the display device of FIG. 12.

FIGS. 12 and 13 show a display device 30. The display device 30 differs from the display device 10 for the display device 30 further includes a backlight module 33. The backlight module 33 is arranged on one side of the display element 31 distal from the image compensation element 32.

The backlight module 33 supplies light to the display element 31, wherein an intensity of first light beams to the main display region 310 is smaller than an intensity of second light beams to the periphery display region 312. In this embodiment, the backlight module 33 is a surface light surface and includes a main emitting region 301 and a periphery emitting region 302 located one side of the main emitting region 301. The intensity of the first light beams emitting from the main emitting region 301 is smaller than the intensity of the second light beams emitted from the periphery display region 302.

In this embodiment, the backlight module 33 includes light sources 332, a light guiding plate 330, and a brightness enhancement element 334 corresponding to the periphery display region 312. The brightness enhancement element 334 is a number of micro-members formed on the light guiding plate 330. The brightness enhancement element 334 is optimally prisms, V-shaped grooves, and columnar lens.

As the second light beams expand to one side of the periphery display region 312 by the image compensation element 32 and become weak, it is need to make the intensity of first light beams to the main display region 310 smaller than the intensity of second light beams to the periphery display region 312, so that an intensity of the image displayed by the display device 30 is uniform.

Figure 14:
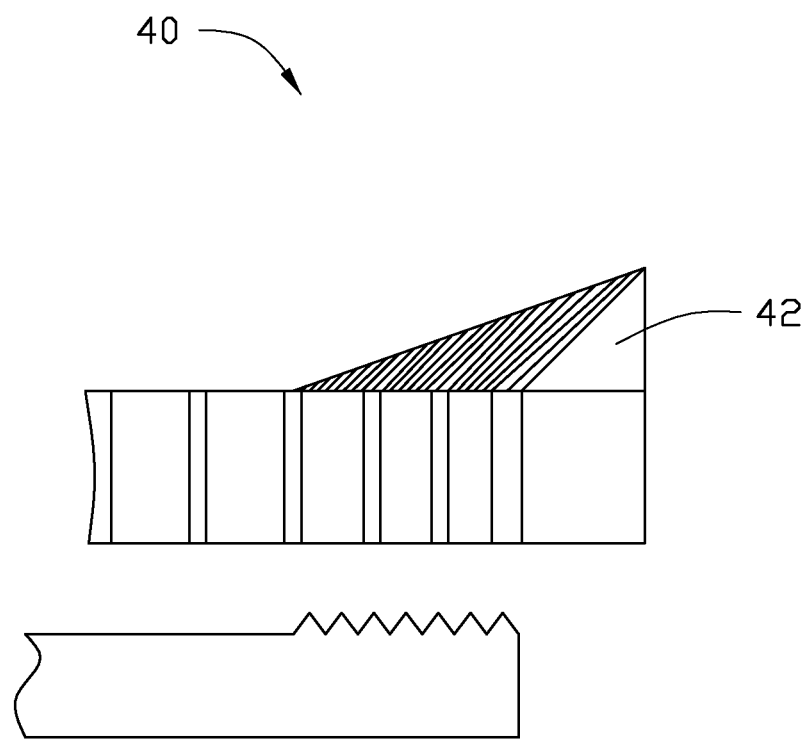
FIG. 14 is a schematic, sectional view of a sixth kind of display device of the present disclosure.

FIG. 14 shows a display device 40. The display device 40 differs from the display device 30 for the display device 40 includes an image compensation element 42 which is same as the image compensation element 22 shown in FIGS. 5 and 6.

Figure 15:
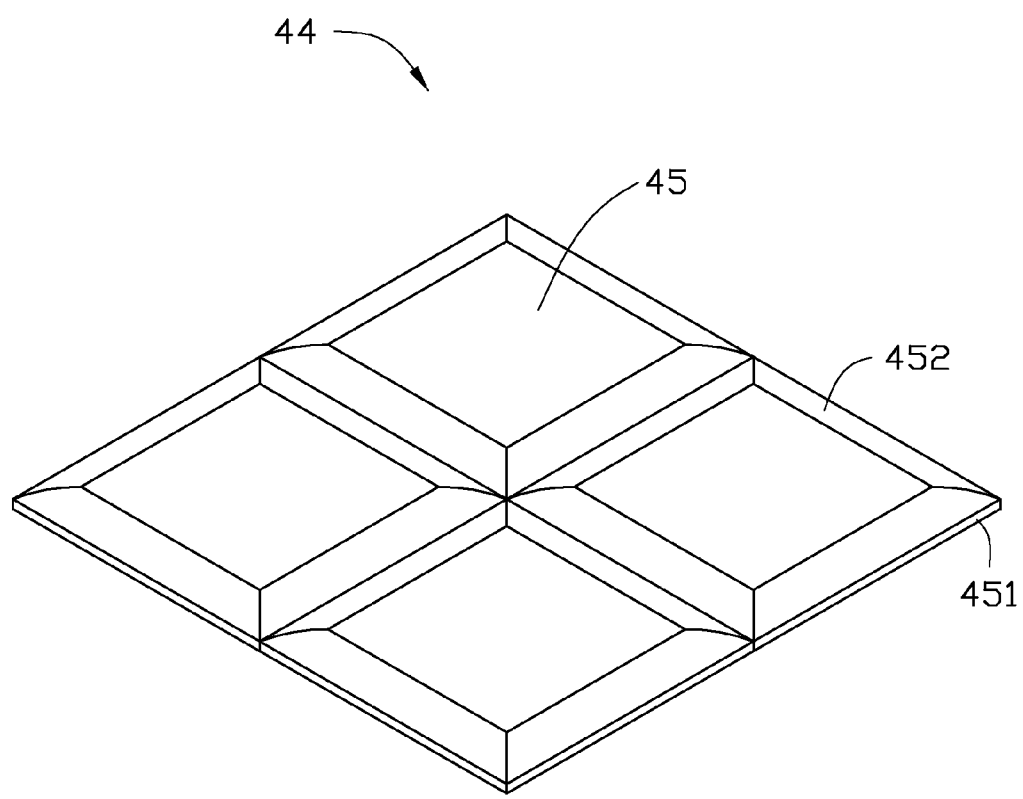
FIG. 15 is a schematic, isometric view of a first kind of joint display of the present disclosure.

FIG. 15 shows a joint display 44. The joint display 44 includes a number of display devices 45 jointed together. The display device 45 is same as the display device 10 and includes a display element 451 and an image compensation element 452.

Figure 16:
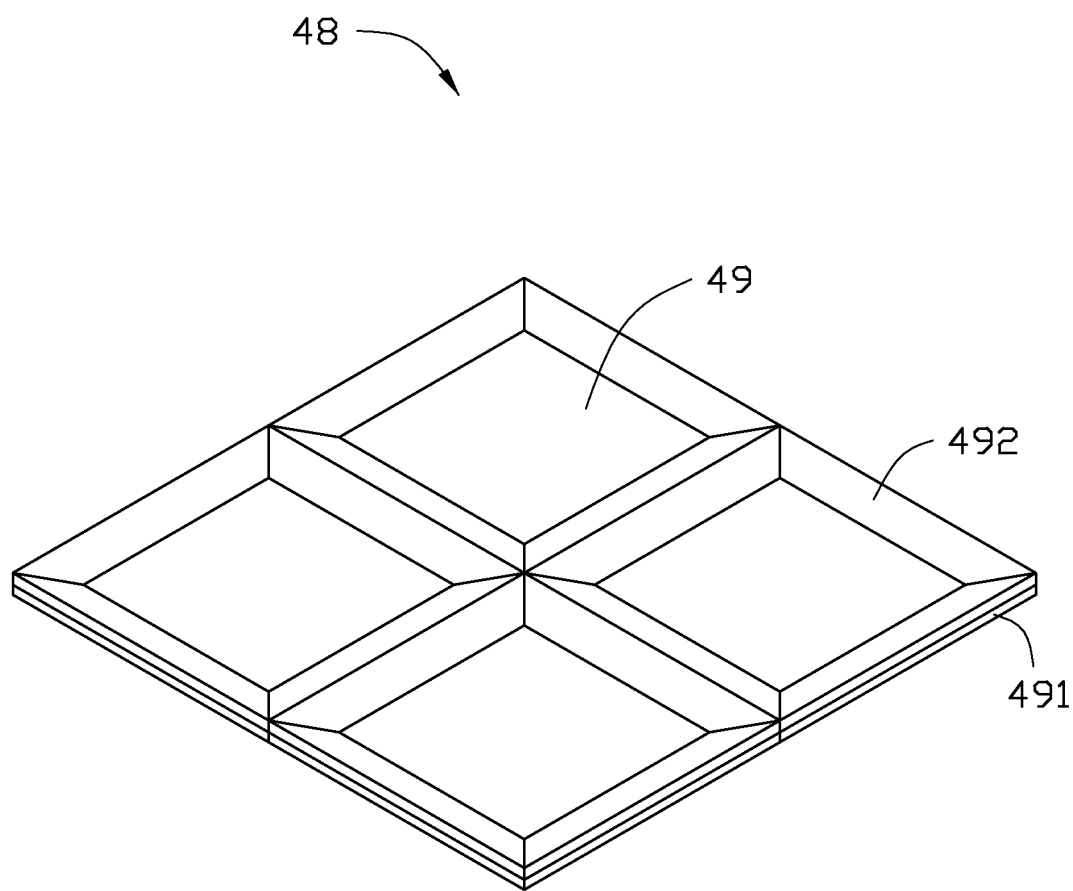
FIG. 16 is a schematic, isometric view of a second king of joint display of the present disclosure.

FIG. 16 shows a joint display 48. The joint display 48 includes a number of display devices 49 jointed together. The display device 49 is same as the display device 20 and includes a display element 491 and an image compensation element 492.

The display elements 451, 491 can be jointed together. The image compensation elements 452, 492 can be jointed together to form a single image compensation element.

As the image compensation elements 452, 492 cover the non-display regions of each display elements 451, 491, the non-display regions are invisible and have no effects to the display effect of the joint display 45, 49. In this way, the display effect of the joint display 45, 49 is enhanced.

Figure 17:
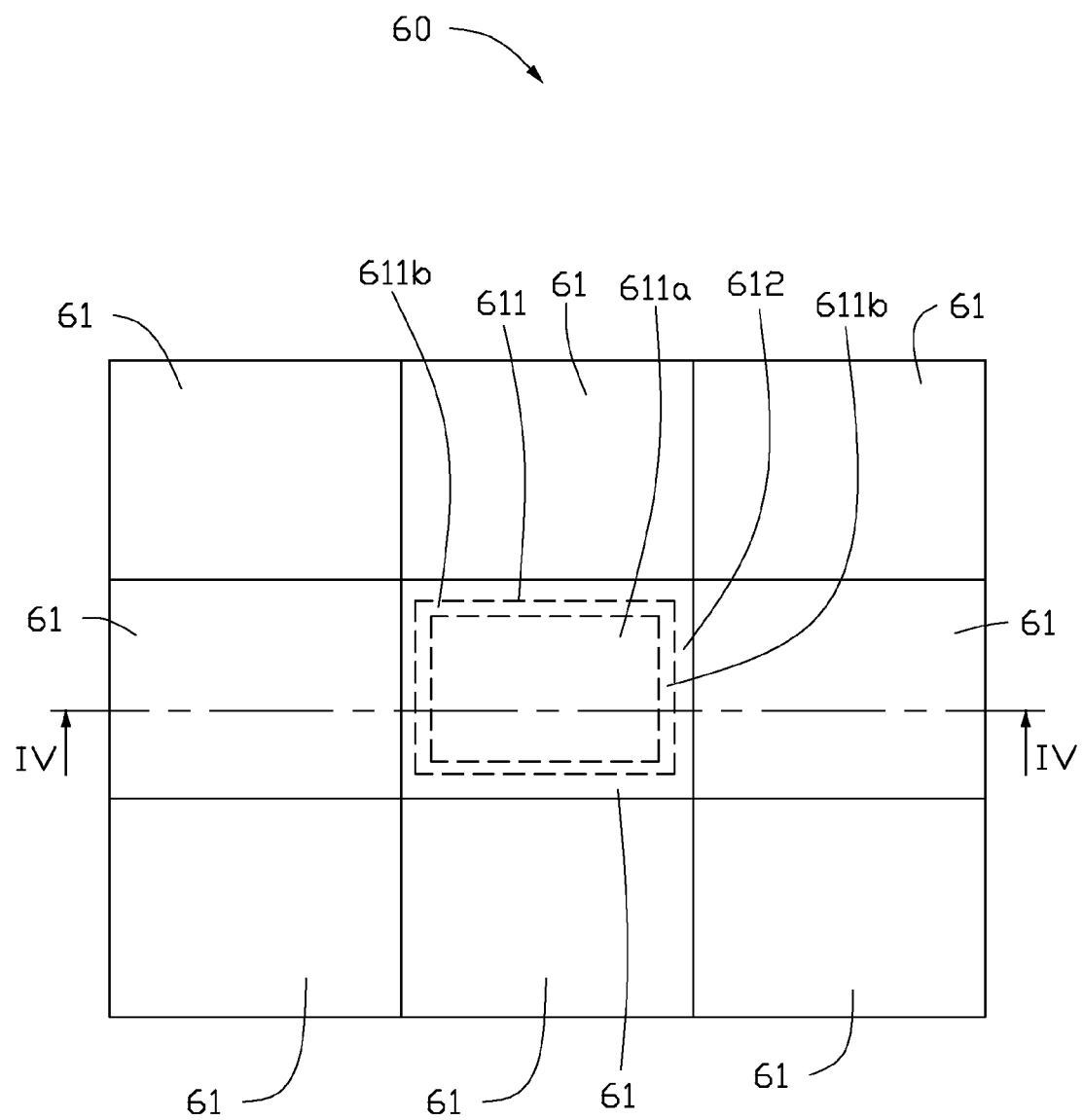
FIG. 17 is a schematic, top view of a third kind of joint display of the present disclosure.
Figure 18:
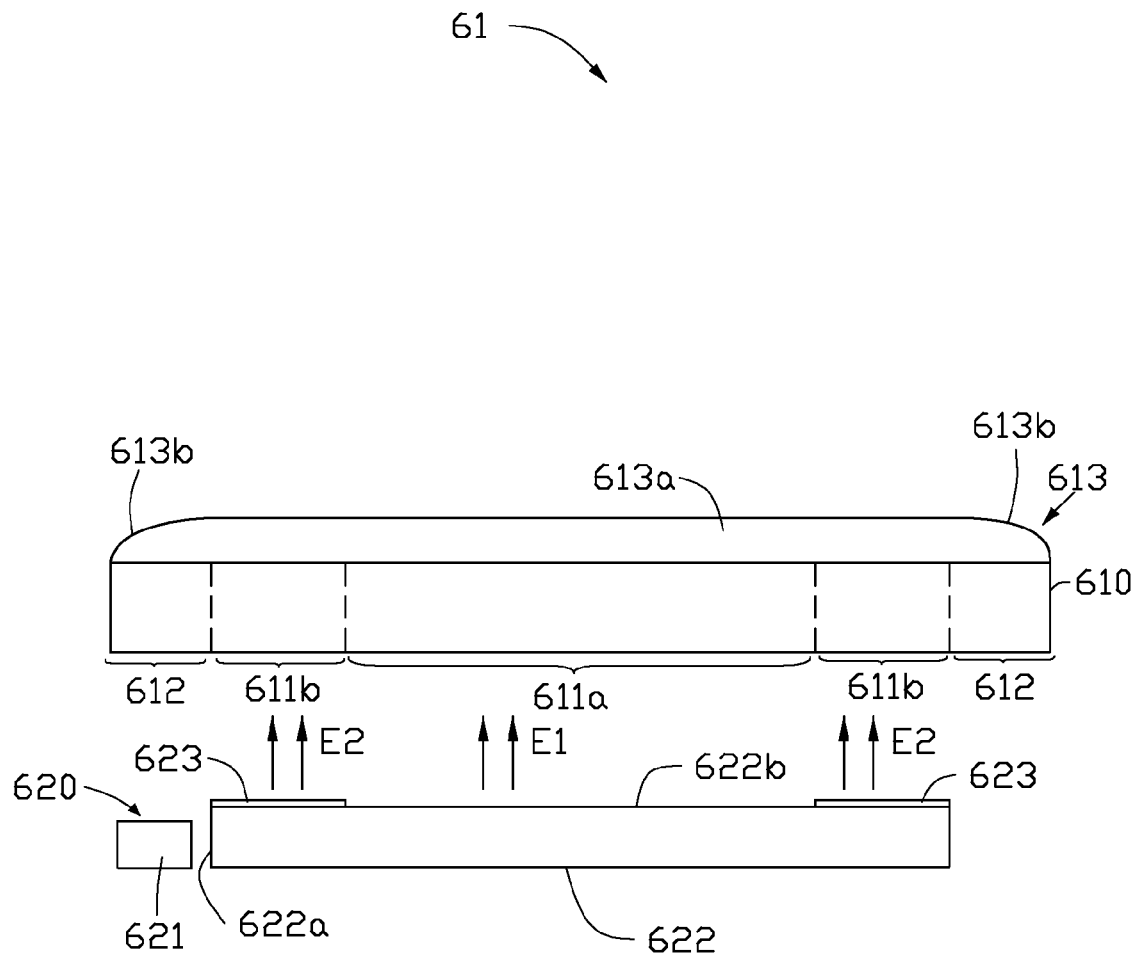
FIG. 18 is a schematic, sectional view taken along IV-IV line of FIG. 16.

FIG. 17 shows a joint display 60. The joint display 60 includes a number of display units 61 arranged on a same plane. FIG. 18 shows a display unit 61. The display unit 61 includes a display panel 610, a backlight module 620 and a lens 613. The backlight module 620 is located on a light incident side of the display panel 610. The lens 613 is located on a light emitting side of the display panel 610. The display panel 610 displays an image. The backlight module 620 supplies light to the display panel 610. Each display unit 61 can be a display device capable of displaying an image independently.

The display unit 61 includes a display surface divided into a display region 611 and a non-display region 612. The display region 611 is constructed by pixel units. The non-display region 612 surrounds the display region 611. The display region 611 includes a main display region 611a and a periphery display region 611b located one side of the main display region 611a.

The lens 613 at least covers the periphery display region 611b and parts of the non-display region 612 for enlarging an image of the periphery display region 611b. In this embodiment, the lens 613 covers the whole display surface, including the display region 611 and the non-display region 612. The lens 613 includes a flat transmission portion 613a and a converging portion 613b. The flat transmission portion 613a corresponds to the main display region 611a. The converging portion 613b corresponds to the periphery display region 611b and the non-display region 612. A transmission direction of the light emitted from the main display region 611a keeps constant after entering the flat transmission portion 613a. The light emitted from the periphery display regions 611b changes a transmission direction and is converged after entering the converging portion 613b. In this way, light emitted from the flat transmission portion 613a and the converging portion 613b are substantially parallel to each other. In this embodiment, the converging portion 613b has a arc surface and is a convex lens.

The backlight module 620 includes light sources 621 and a light guiding plate 622. The light guiding plate 622 includes a light incident surface 622a and a light emitting surface 622b adjacent to the light incident surface 622a. The light emitting surface 622b is located right below the display region 611 and a size of the light emitting surface 622b corresponds to a size of the display region 611. Light emitted from the light sources 610 enters the light guiding plate 622 and is guided to the display panel 610 by the light guiding plate 622, for the display panel 610 can display image. In this embodiment, the backlight module 620 is a side lighted backlight module, in other embodiment, the backlight module 620 can also be a direct type backlight module.

Light emitted from the backlight module 620 includes first light beams E1 irradiated to the main display region 611a and second light beams E2 irradiated to the periphery display region 611b. An intensity of the first light beams E1 is smaller than an intensity of the second light beams E2.

Figure 19:
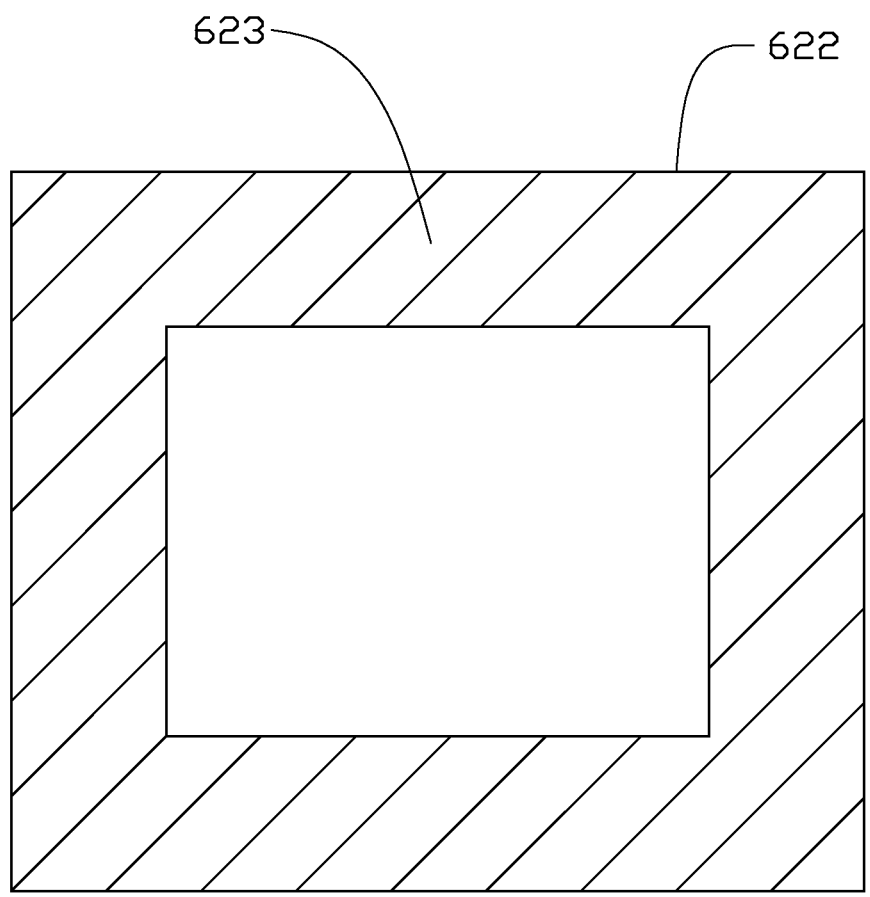
FIG. 19 is a schematic view of a backlight module of the joint display of FIG. 17.

FIG. 19 shows the structure of the light guiding plate 622. The light guiding plate 622 includes a first brightness enhancement element 623 on the light emitting surface 622b corresponding to the periphery display region 611b. The first brightness enhancement element 623 enhances an intensity of the second light beams E2 irradiated to the periphery display region 611b, and makes the intensity of the first light beams E1 is smaller than the intensity of the second light beams E2.

In this embodiment, the first brightness enhancement element 623 is a brightness enhancement film. The brightness enhancement film is a transparent poly(ethylene terephthalate) optical film and a surface of the brightness enhancement film has a pattern formed by acrylic resin.

Figure 20:
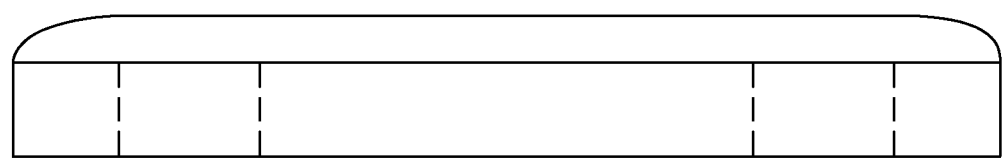
FIG. 20 is a front view of the joint display of FIG. 17 showing the backlight module having a first kind of structure.
Figure 20:
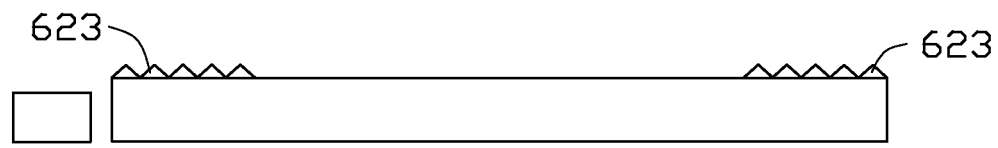

FIG. 20 shows another kind of the first brightness enhancement element 623. In FIG. 20, the first brightness enhancement element 623 includes a number of prisms projected from the light emitting surface 622b corresponding to the periphery display region 611b towards the display panel 610.

Figure 21:
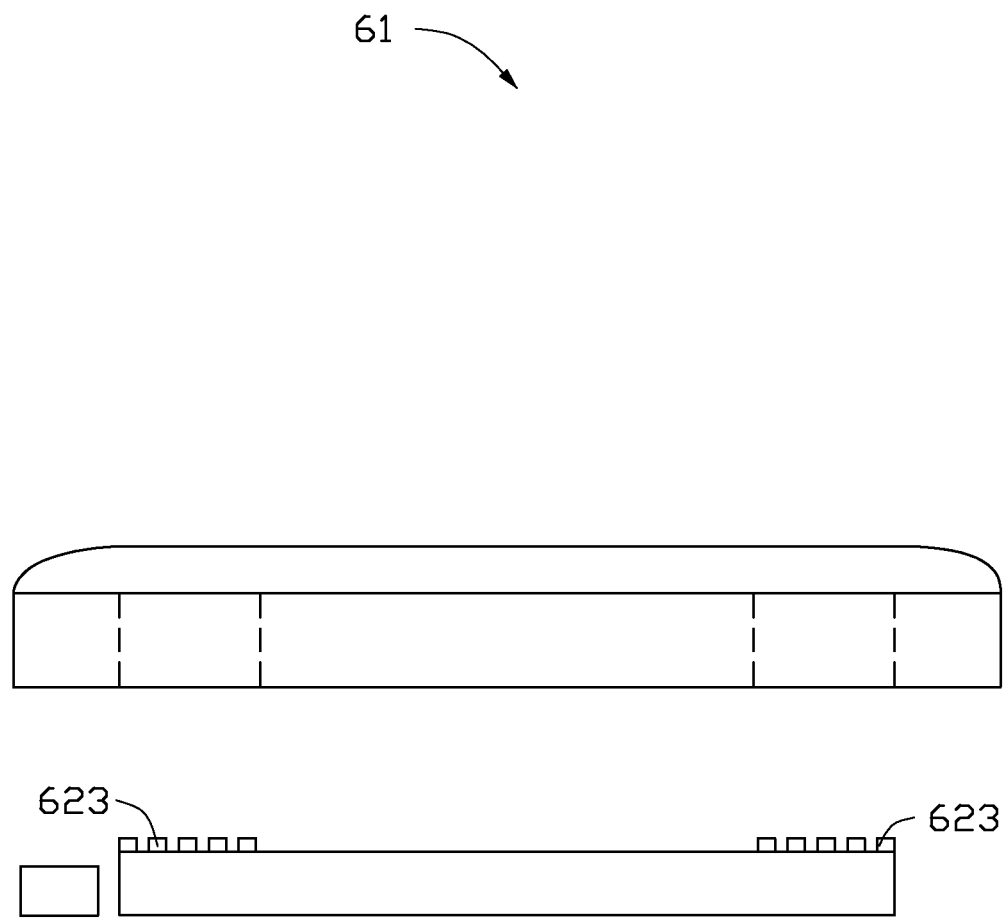
FIG. 21 is similar to FIG. 20, but showing the backlight module having a second kind of structure.

FIG. 21 shows another kind of the first brightness enhancement element 623. In FIG. 21, the first brightness enhancement element 623 includes a number of column lens.

Figure 22:
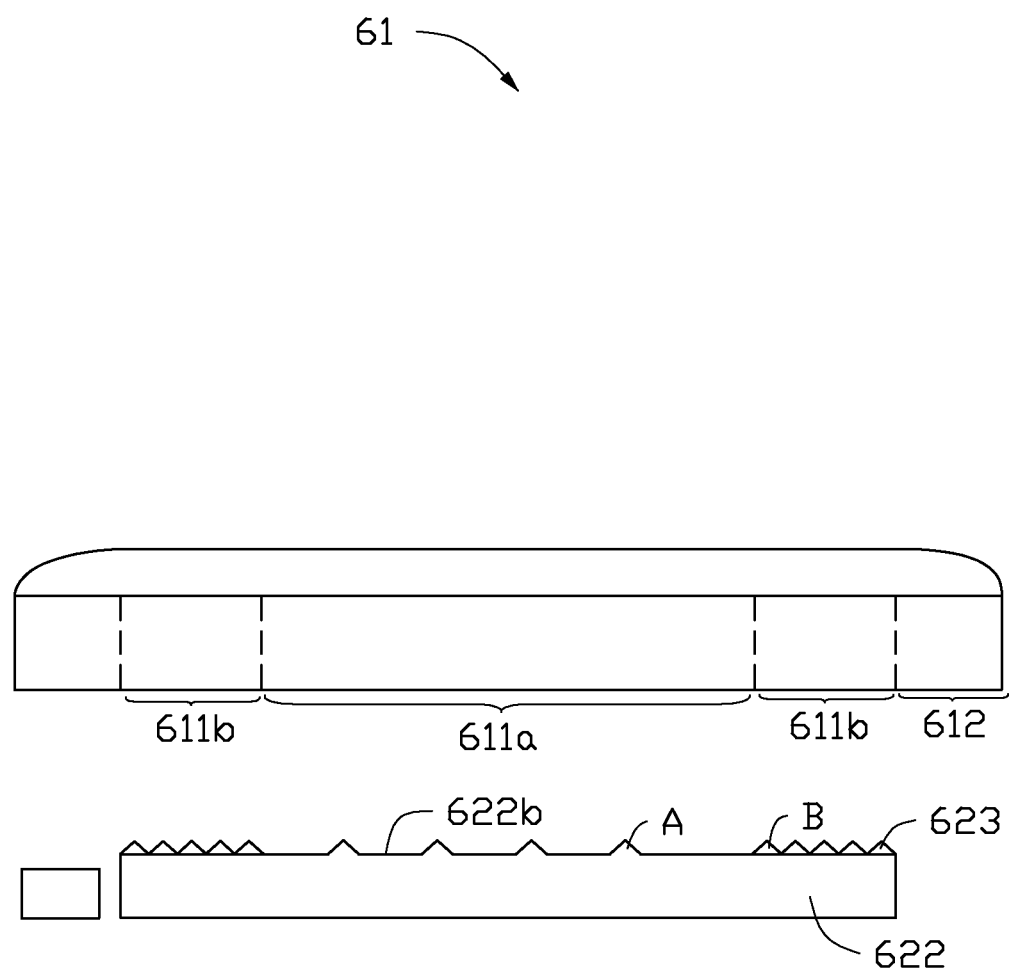
FIG. 22 is similar to FIG. 20, but showing the backlight module having a third kind of structure.

FIG. 22 shows another kind of the first brightness enhancement element 623. In FIG. 22, the first brightness enhancement element 623 includes a number of first prisms A located corresponding to the main display region 611a on the light emitting surface 622b, and a number of second prisms B located corresponding to the periphery display region 611b on the light emitting surface 622b. An average distance between the second prisms B is smaller than an average distance between the first prisms A, that is, a density of the first prisms A is smaller than a density of the second prisms B.

Figure 23:
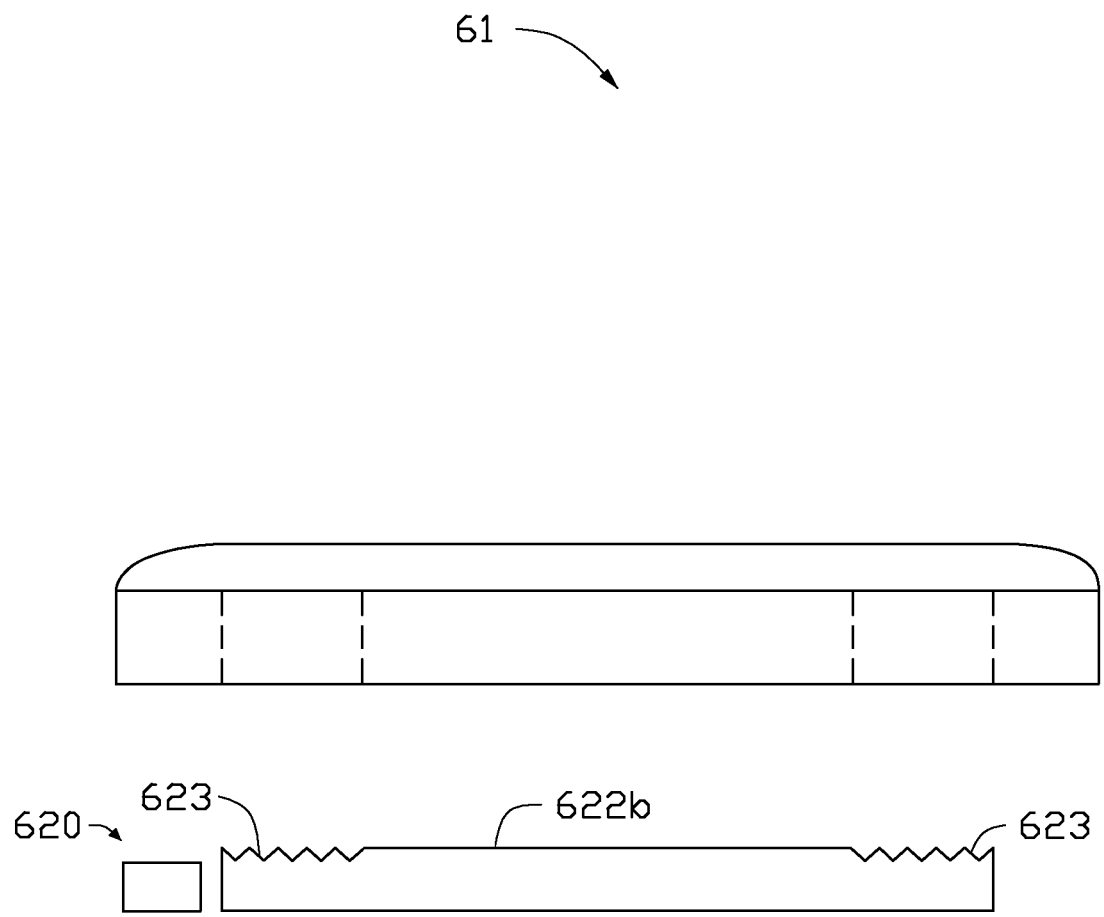
FIG. 23 is similar to FIG. 20, but showing the backlight module having a fourth kind of structure.
Figure 24:
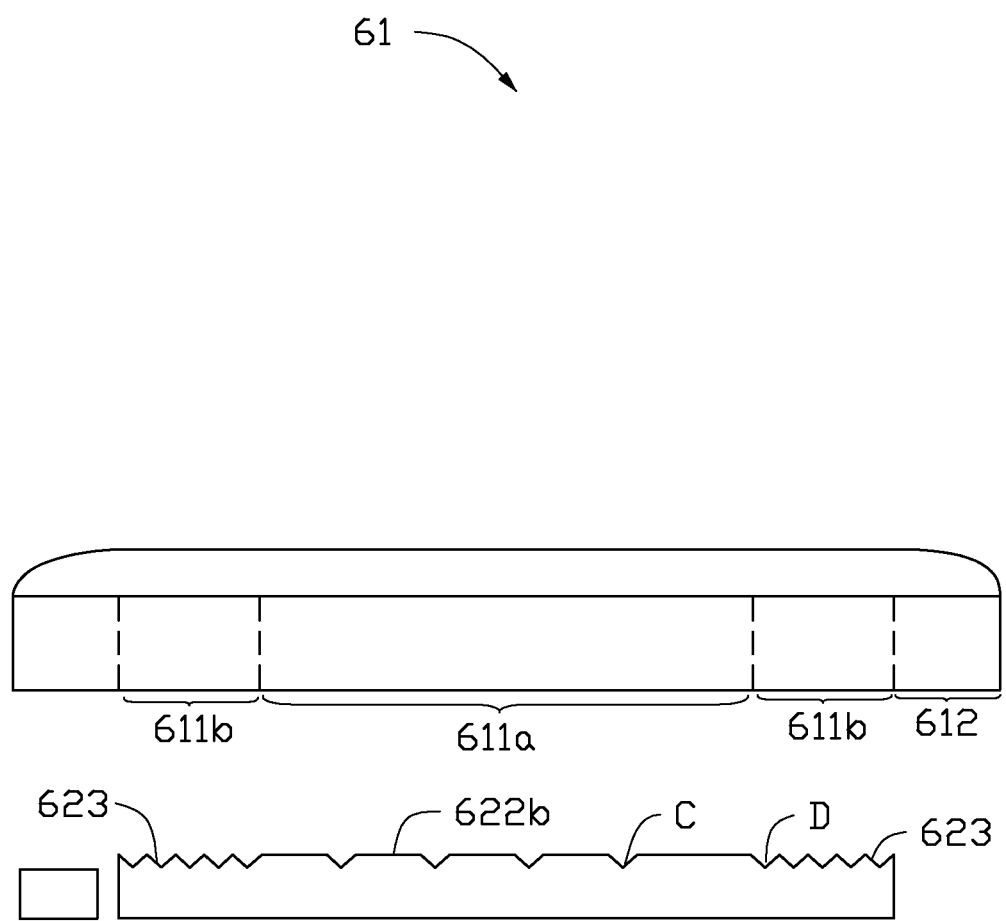
FIG. 24 is similar to FIG. 20, but showing the backlight module having a fifth kind of structure.

FIG. 23 shows another kind of the first brightness enhancement element 623. In FIG. 23, the first brightness enhancement element 623 includes a number of V-shaped grooves formed on the light emitting surface 622b of the light guiding plate 622 corresponding to the periphery display portion 611b.

FIG. 23 shows another kind of the first brightness enhancement element 623. In FIG. 23, the first brightness enhancement element 623 includes a number of first V-shaped grooves C located corresponding to the main display region 611a on the light emitting surface 622b, and a number of second V-shaped grooves D located corresponding to the periphery display region 611b on the light emitting surface 622b. An average distance between the second V-shaped grooves D is smaller than an average distance between the first V-shaped grooves C, that is, a density of the V-shaped grooves C is smaller than a density of the V-shaped grooves D.

In other embodiment, the first brightness enhancement element 623 can includes a number of ladder-shaped grooves.

In other embodiment, the backlight module 620 can also includes diffusion pieces, reflection pieces, and so on. The first brightness enhancement element 623 can also be located on other optical pieces adjacent to the display panel 610, such as on an upper diffusion piece.

Figure 25:
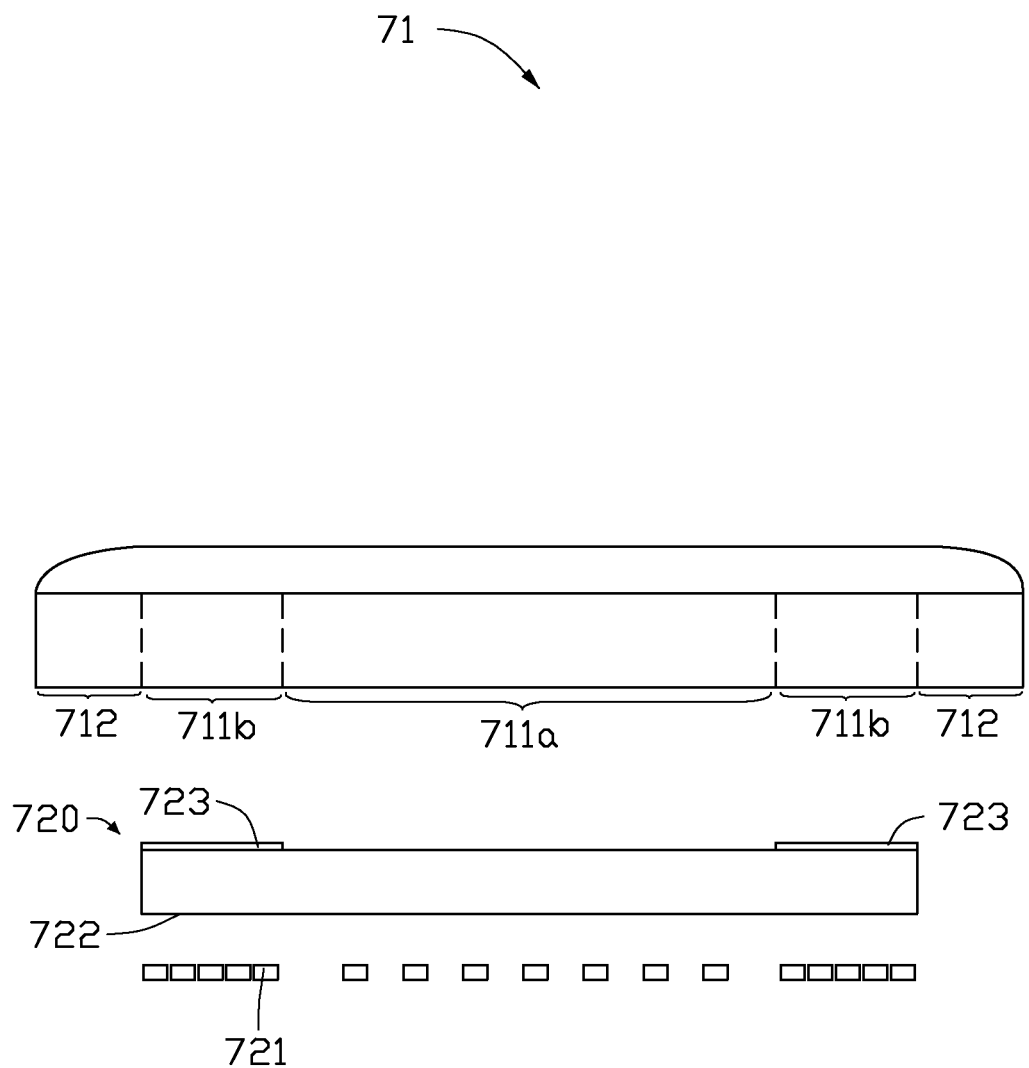
FIG. 25 is a schematic, front view of a fourth kind of joint display of the present disclosure.

FIG. 25 shows a display unit 71. The display unit 71 is similar to the display unit 60 shown in FIG. 18, but differs that a backlight module 720 of the display unit 71 is a direct type backlight module and has no light guiding plate. The backlight module 720 includes a diffusion piece 722 for supporting or forming a first brightness enhancement element 723.

For increasing an intensity of the light emitted from the backlight 720 corresponding to a periphery display region 711b, a number of light sources 721 corresponding to the periphery display region 711b is increased, or an intensity of the light emitted from the light sources 721 corresponding to the periphery display region 711b is increased. In this way, an intensity of light irradiated to the periphery display region 711b is greater than an intensity of light irradiated to a main display region 711a. In other embodiment, the first brightness enhancement element 723 can also be removed.

Figure 26:
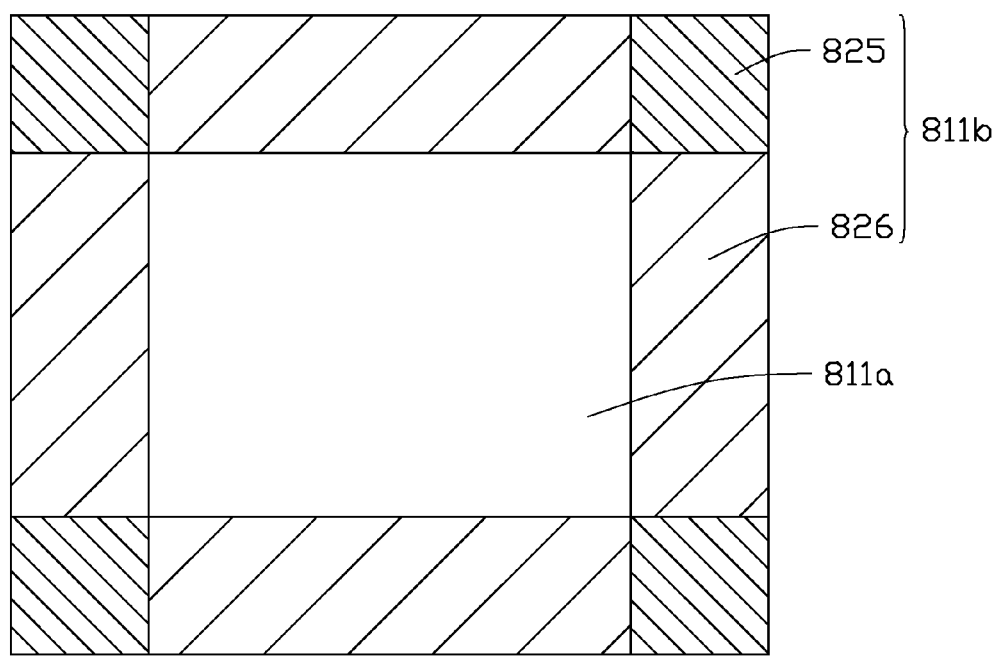
FIG. 26 is a schematic view of a back light module of a fifth kind of joint display of the present disclosure.

FIG. 26 shows a display unit similar to the display unit 61 shown in FIG. 19, but differing in the structure of a periphery display region 811b of the display unit of FIG. 26. The periphery display region 811b includes four strip regions 826 and four corner regions 825. Each strip region 826 is located between and connected to two of the corner regions 825. A second light beams provided to the periphery display region 811b includes a first part of light provided to the stripe regions 826 and a second part of light provided to the corner regions 825, an intensity of the first part is smaller than an intensity of the second part, and an intensity of the first part is greater than an intensity of a first light beams provided to a main display region 811a. In this embodiment, a second brightness enhancement element is provided to increase the intensity of light provided to the corner regions 825.

In other embodiment, the periphery display region 811b does not surrounds the main display region 811a and just located on two opposite sides of the main display region 811a.

Figure 27:
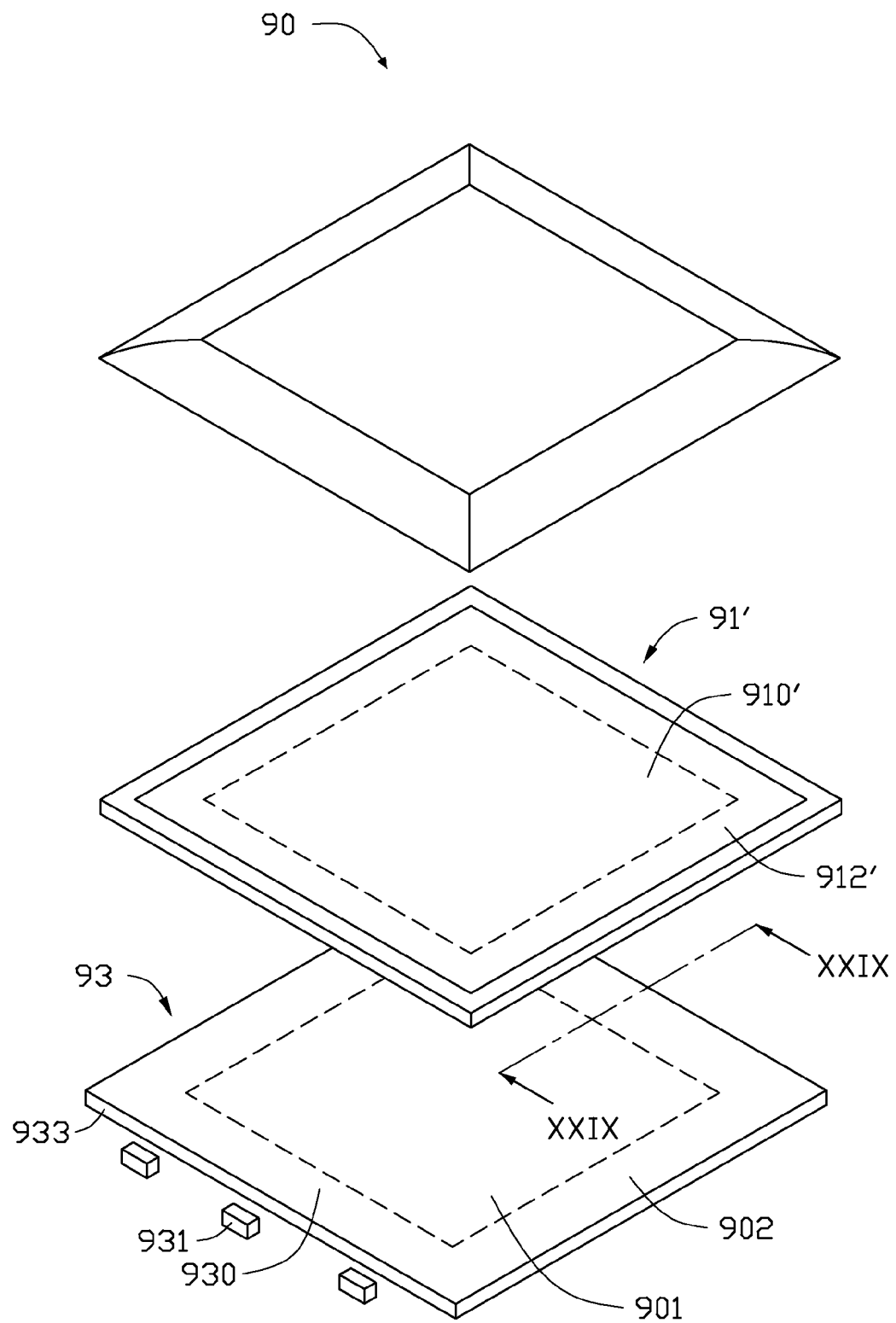
FIG. 27 is a schematic, exploded view of a seventh kind of display device of the present disclosure.
Figure 28:
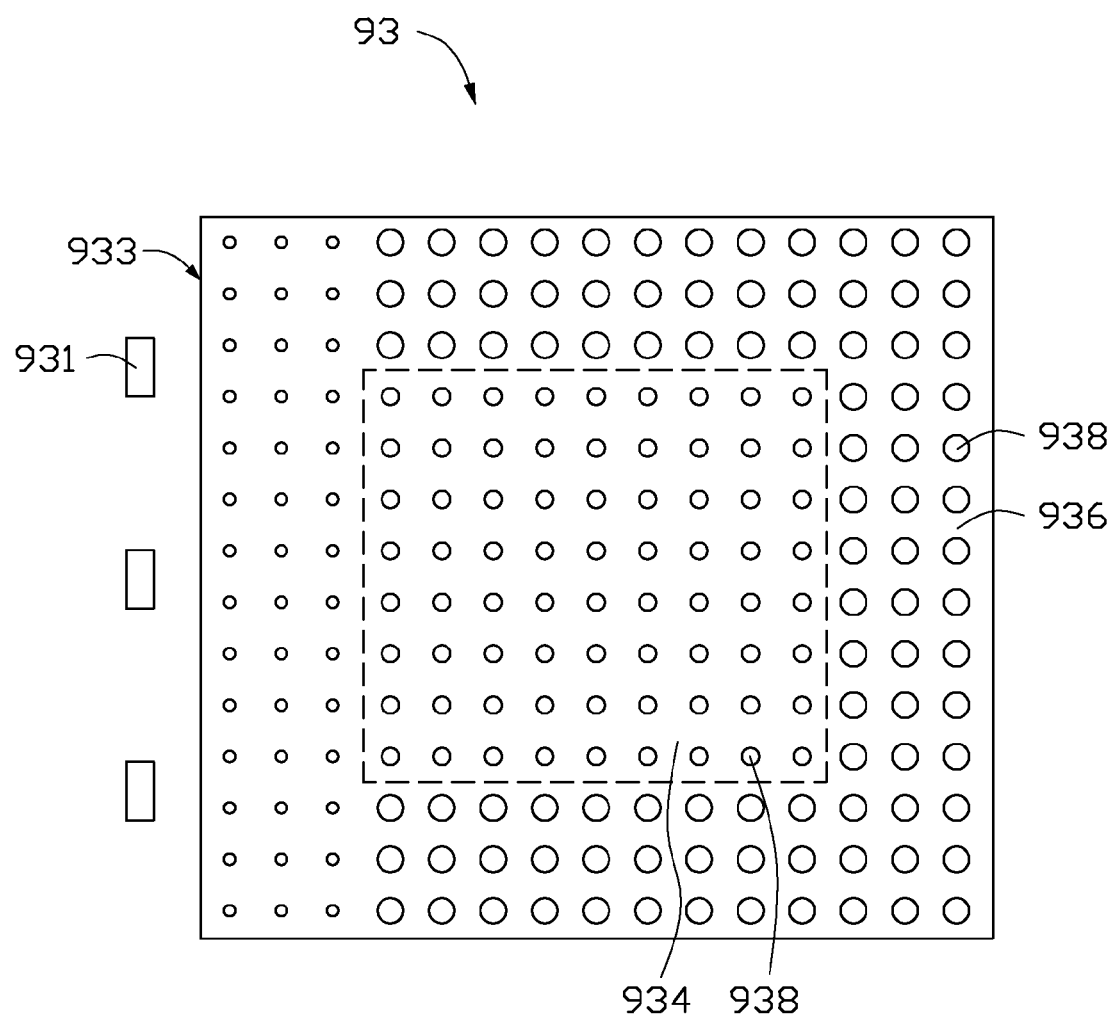
FIG. 28 is a bottom view of a backlight module of the display device of FIG. 27.
Figure 29:
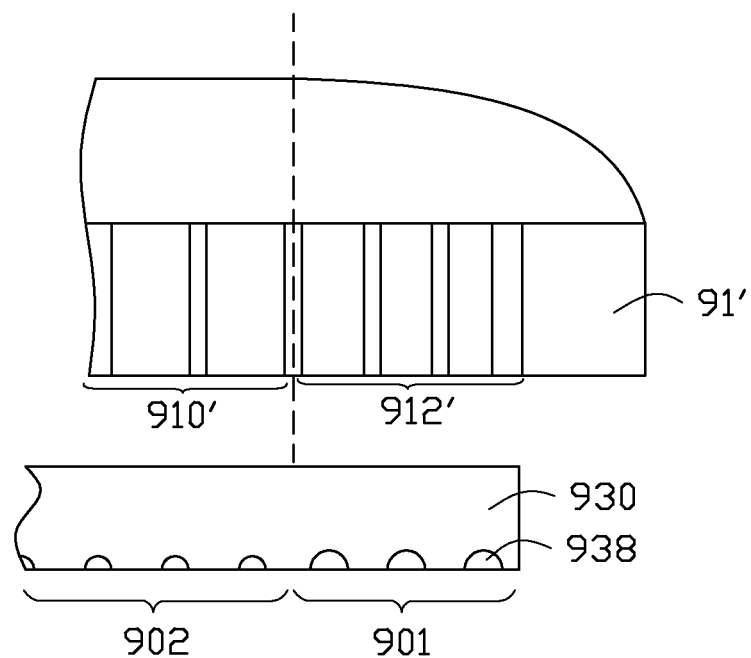
FIG. 29 is a partial, enlarged front view of the display device of FIG. 27.

FIGS. 27 through 29 show a display device 90. The display device 90 is similar to the display device 30 of FIG. 12 but differs in the structure of backlight module. The display device 90 includes a backlight module 93 and a display unit 91'. The display unit 91' includes a main display region 910' and a periphery display region 912'. The backlight module 93 includes a light guiding plate 930 and light sources 931 located adjacent to one side of the light guiding plate 930. The light guiding plate 930 includes a main emitting region 901 corresponding to the main display region 910' and a periphery emitting region 902 corresponding to the periphery display region 912'. The light guiding plate 930 further includes a bottom surface 932. The bottom surface 932 includes a first region 934 corresponding to the main display region 910' and a second region 936 corresponding to the periphery display region 912'. A number of dots 938 if formed on the bottom surface 932 by means of printing.

A dot density of the first region 934 is the same as a dot density of the second region 936, but a size of each dot 938 in the first region 934 is smaller than a size of each dot 938 in the second region 936. In detail, a size of each dot 938 (an area that each dot 938 occupies) in the second region 936 is 1.5 to 4 times to that in the first region 934.

As the dots 938 in the second region 936 are relatively big, an brightness of the backlight module 93 corresponding to the periphery display region 912' is increased, and an intensity of first light beams provided to the main display region 910' is smaller than an intensity of second light beams provided to the periphery display region 912'.

Figure 30:
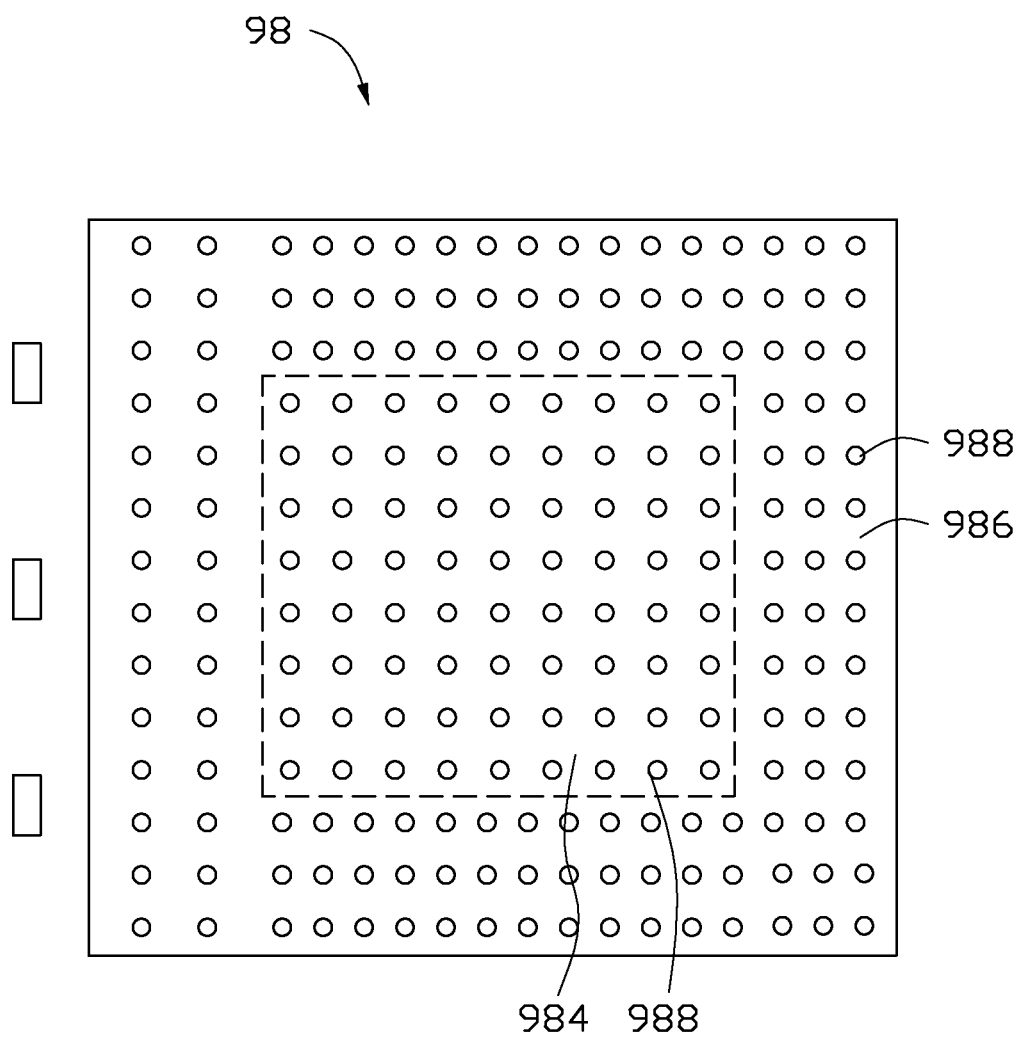
FIG. 30 is a bottom view of a backlight module of a eighth kind of display device of the present disclosure.

FIG. 30 shows a backlight 98. the backlight 98 is similar to backlight 93 shown in FIG. 28, but differs that in the backlight 98, a dot density of a first region 984 is smaller than a dot density of a second region 986, but a size of each dot 988 in the first region 984 the same a size of each dot 938 in the second region 986. In detail, a dot density (number of dots per unit area) of the second region 986 is 1.5 to 4 times to that of the first region 934. As the dot density of the second region 986 relatively high, a brightness of a periphery emitting region of the backlight 98 is increased.

In other embodiment, joint display 44 and 48 can also use the display device and backlight modules shown in FIGS. 27 through 30.

It is to be understood that even though numerous characteristics and advantages of the present embodiments have been set forth in the foregoing description, together with details of the structures and functions of the embodiments, the disclosure is illustrative only; and that changes may be made in detail, especially in matters of shape, size, and arrangement of parts, within the principles of the embodiments, to the full extent indicated by the broad general meaning of the terms in which the appended claims are expressed.

What is claimed is:

1. A display device, comprising:
a display element comprising a main display region and a periphery display region located at one side of the main display region, the main display region comprising a plurality of pixels, the periphery display region comprising a plurality of pixels, wherein a pixel density of the periphery display region increases along a first direction, and the first direction points away from the main display region toward the periphery display region;
an image compensation element comprising a compensation portion corresponding to the periphery display region, and the image compensation element extending an image of the periphery display region to one side of the periphery display region away from the main display region;
a backlight module providing first light beams to the main display region and providing second light beams to the periphery display region, and an intensity of the first light beams being smaller than an intensity of the second light beams.

2. The display device of claim 1, wherein the backlight module comprises a brightness enhancement element corresponding to the periphery display region.

3. The display device of claim 2, wherein the backlight module further comprises a light guiding plate, the light guiding plate comprises a plurality of first micro-members located corresponding to the periphery display region, and the first micro-members constitute the brightness enhancement element.

4. The display device of claim 3, wherein the light guiding plate further comprises a plurality of second micro-members located corresponding to the main display region, the first micro-members and the second micro-members are located on a top surface of the light guiding plate, and a density of the first micro-members is greater than a density of the second micro-members.

5. The display device of claim 3, wherein the first micro-members are selected from the group of prisms, V-shaped grooves, and columnar lens.

6. The display device of claim 1, wherein the backlight module further comprises a light guiding plate, the light guiding plate comprises a bottom surface, the bottom surface comprises a first region corresponding to the main display region and a second region corresponding to the periphery display region, and the second region comprises a plurality of second dots.

7. The display device of claim 6, wherein the first region comprises a plurality of first dots, a size of each first dot is the same as a size of second dot, and a dot density of the first region is less than a dot density of the second region.

8. The display device of claim 6, wherein the first region comprises a plurality of first dots, a size of each first dot is greater than a size of each second dot of the second region, and a dot density of the first region is the same as a dot density of the second region.

9. The display device of claim 1, wherein the periphery display region comprises a stripe region and two corner regions, the strip region is located between the two corner regions, the second light beams comprise a first part of light provided to the stripe region and a second part of light provided to the corner regions, a light density of the first part is smaller than a light density of the second part.

10. The display device of claim 1, wherein a pixel density of the main display region is smaller than a pixel density of the periphery display region.

11. The display device of claim 1, wherein the display element further comprises a non-display region located at one side of the periphery display region away from the main display region, and the compensation portion extends the image of the periphery display region to the non-display region.

12. The display device of claim 11, wherein the compensation portion comprises an arc-shaped surface which defines a convex lens structure, and the compensation portion covers the periphery display region and the non-display region.

13. The display device of claim 11, wherein the compensation portion defines a plurality of light guiding channels independent from each other, the plurality of light guiding channels transmit light from the periphery display region to the side of the periphery display region away from the main display region.

14. The display device of claim 13, wherein the compensation portion comprises a light incident surface and a light emitting surface, the light incident surface corresponds to the periphery display region, an area of the light emitting surface is greater than an area of the light incident surface, and each light guiding channel extends along a direction from the light incident surface to the light emitting surface.

15. The display device of claim 14, wherein the compensation portion comprises a plurality of light guiding fibers each extending along the direction from the light incident surface to the light emitting surface, each light guiding channel is defined by a corresponding light guiding fiber of the plurality of light guiding fibers, and an area of the light guiding fiber on the light emitting surface is greater than an area of the light guiding fiber on the light incident surface.

16. The display device of claim 14, wherein a section area of the light guiding fiber increases along the direction from the light incident surface to the light emitting surface.

17. The display device of claim 14, wherein a section area of the light guiding fiber is maintained constant.

18. A joint display, comprising:
- at least two display elements joining each other, one of the at least two display elements comprising a main display region and a periphery display region located one side of the main display region, the main display region comprising a plurality of pixels, the periphery display region comprising a plurality of pixels, wherein a pixel density of the periphery display region increases along a first direction, and the first direction points away from the main display region toward the periphery display region;
- an image compensation element comprising a compensation portion corresponding to the periphery display region, and the image compensation element extending the image of the periphery display region to one side of the periphery display region away from the main display region; and
- a backlight module providing first light beams to the main display region and providing second light beams to the periphery display region, and an intensity of the first light beams being smaller than an intensity of the second light beams.

19. The joint display of claim 18, wherein said one of the at least two display elements further comprises a non-display region located at one side of the periphery display region away from the main display region, and the compensation portion extends the image of the periphery display region to the non-display region.

\* \* \* \* \*